US012787250B2

(12) United States Patent
Hwang

(10) Patent No.: US 12,787,250 B2
(45) Date of Patent: Nov. 3, 2026

(54) MEMORY DEVICE AND MANUFACTURING METHOD THEREOF

(71) Applicant: Seoul National University R&DB foundation, Seoul (KR)

(72) Inventor: Cheol Seong Hwang, Seoul (KR)

(73) Assignee: Seoul National University R&DB foundation, Seoul (KR)

( * ) Notice: Subject to any disclaimer, the term of this patent is extended or adjusted under 35 U.S.C. 154(b) by 444 days.

(21) Appl. No.: 18/571,368

(22) PCT Filed: Nov. 7, 2023

(86) PCT No.: PCT/KR2023/017735
§ 371 (c)(1),
(2) Date: Dec. 18, 2023

(87) PCT Pub. No.: WO2024/195956
PCT Pub. Date: Sep. 26, 2024

(65) Prior Publication Data

US 2025/0089232 A1 Mar. 13, 2025

(30) Foreign Application Priority Data

Mar. 23, 2023 (KR) ........................ 10-2023-0038120

(51) Int. Cl.
*H10B 12/00* (2023.01)

(52) U.S. Cl.
CPC ............ *H10B 12/05* (2023.02); *H10B 12/03* (2023.02); *H10B 12/30* (2023.02)

(58) Field of Classification Search
CPC ........ H10B 12/05; H10B 12/03; H10B 12/30; H10B 12/00; H10B 12/482; H10B 12/488
See application file for complete search history.

(56) References Cited

U.S. PATENT DOCUMENTS 11,469,232 B2 10/2022 Lee
11,538,808 B2 * 12/2022 Ma ........................ G11C 11/401
(Continued)

FOREIGN PATENT DOCUMENTS

KR 10-2019-0038223 4/2019
KR 10-2021-0075269 6/2021
(Continued)

OTHER PUBLICATIONS

International Search Report mailed Feb. 7, 2024 for PCT/KR2023/017735.

*Primary Examiner* — Victor A Mandala

(57) ABSTRACT

The present disclosure discloses a manufacturing method of a memory device including forming a structure including an epitaxial material plug extending vertically on a substrate, an epitaxial material layer extending horizontally from a side surface of the epitaxial material plug, and a gate insulating material layer formed at least on a surface of the epitaxial material layer, defining a transistor including a word line by forming the word line in contact with the gate insulating material layer in a transistor formation region around the epitaxial material plug in the structure, removing the epitaxial material layer and the gate insulating material layer from a capacitor formation region adjacent to the transistor formation region of the structure, and forming a capacitor connected to one end of the epitaxial material layer corresponding to a channel of the transistor.

24 Claims, 27 Drawing Sheets

(56) References Cited

U.S. PATENT DOCUMENTS

| | | | | |
|---|---|---|---|---|
| 2018/0323199 | A1* | 11/2018 | Roberts | H10B 12/03 |
| 2020/0083225 | A1* | 3/2020 | Ma | G11C 11/401 |
| 2021/0249415 | A1 | 8/2021 | Kang et al. | |
| 2022/0254784 | A1* | 8/2022 | Lee | H10B 12/02 |
| 2022/0278106 | A1* | 9/2022 | Kim | H10B 12/30 |
| 2023/0247821 | A1* | 8/2023 | Kwon | H10B 12/482<br>257/296 |
| 2023/0253242 | A1* | 8/2023 | Kim | H10B 12/03<br>438/210 |
| 2023/0255015 | A1* | 8/2023 | Shin | H10B 12/03<br>257/296 |
| 2023/0269928 | A1* | 8/2023 | Yoon | H10B 12/30<br>438/239 |
| 2023/0320067 | A1* | 10/2023 | Kim | H10B 12/05<br>438/239 |
| 2023/0380145 | A1* | 11/2023 | Chen | H10B 12/02 |
| 2023/0389280 | A1* | 11/2023 | Kwak | H10B 12/05 |
| 2023/0397403 | A1* | 12/2023 | Cho | H10B 12/03 |
| 2023/0413517 | A1* | 12/2023 | Kim | H10B 12/00 |
| 2024/0064959 | A1* | 2/2024 | Kim | H10B 12/30 |
| 2024/0119994 | A1* | 4/2024 | Kim | G11C 11/4085 |
| 2024/0389306 | A1* | 11/2024 | Wang | H10B 12/033 |
| 2025/0089231 | A1* | 3/2025 | Hwang | H10B 12/05 |
| 2025/0261359 | A1* | 8/2025 | Lee | H10B 12/30 |
| 2026/0082876 | A1* | 3/2026 | Kim | H10B 12/03 |

FOREIGN PATENT DOCUMENTS

| | | |
|---|---|---|
| KR | 10-2022-0047047 | 4/2022 |
| KR | 10-2022-0125512 | 9/2022 |
| KR | 10-2022-0166604 | 12/2022 |

* cited by examiner

FIG. 1A
FIG. 1B
S100
S10
S10
SL20
NL20
SL10
NL10
S10
SUB10
Z
Y
X
SL20
(top-view)
Y
X

MEMORY DEVICE AND MANUFACTURING METHOD THEREOF

This application claims the priority of Korean Patent Application No. 10-2023-0038120, filed on Mar. 23, 2023 in the KIPO (Korean Intellectual Property Office), the disclosure of which is incorporated herein entirely by reference. Further, this application is the National Stage application of International Application No. PCT/KR2023/017735, filed on Nov. 7, 2023, which designates the United States and was published in Korean. Each of these applications is hereby incorporated by reference in their entirety into the present application.

TECHNICAL FIELD

The present invention relates to semiconductor/electronic devices and manufacturing methods thereof, and more particularly, to memory devices and manufacturing methods thereof.

BACKGROUND ART

There is a continuous need to increase the performance of semiconductor devices and the degree of integration of semiconductor devices. Arranging unit cells of semiconductor devices two-dimensionally, that is, in a planar manner, is reaching its limit in increasing the degree of integration of semiconductor devices. Accordingly, the attempts are being made to develop technologies that greatly increase the degree of integration of semiconductor devices by three-dimensionally integrating the unit cells of the semiconductor devices. In this regard, the attempts to increase the integration degree of memory devices such as NAND devices or DRAM devices are being attempted in various forms. In addition, research and development are continuously being conducted to improve the performance and operating characteristics of memory devices.

In the manufacture of 3D memory devices, for example, a stacked structure in which Si/SiGe structures are repeatedly stacked hundreds of times is used, but this method has the problems such as very low productivity, high production costs, and high process difficulty. In particular, in forming the stacked structure, there are disadvantages that the epitaxial process time is long and the epitaxial process difficulty is high. Additionally, in the case of the existing method, when the SiGe layer is removed, a problem that the Si layer has difficulty in structurally withstanding may arise.

DISCLOSURE OF THE INVENTION

Technical Problem

The technological object to be achieved by the present invention is to provide a memory device and a manufacturing method thereof which may increase the degree of integration and secure excellent performance, while also facilitating easy processing and reducing manufacturing costs.

In addition, the technological object to be achieved by the present invention is to provide a method of manufacturing a memory device and a memory device manufactured by this method which may improve performance such as mobility by using a single crystal channel material and may easily maximize the height of the capacitor.

The object to be solved by the present invention is not limited to the objects mentioned above, and other objects not mentioned will be understood by those skilled in the art from the description below.

Technical Solution

According to one embodiment of the present invention, there is provided a manufacturing method of memory device comprising: forming a stack including a first insulating layer, a first sacrificial layer, a second insulating layer, and a second sacrificial layer which are sequentially stacked on a substrate; forming a patterned stack having at least one pattern portion having first and second sacrificial layer patterns obtained from the first and second sacrificial layers, respectively by patterning the stack, wherein the pattern portion has a shape extending in a first direction and is provided with etched regions on both sides of the pattern portion along a second direction perpendicular to the first direction; forming a structure including the patterned stack and an insulating material by filling the etched regions on both sides of the at least one pattern portion with the insulating material; forming a first vertical hole penetrating through the first and second sacrificial layer patterns of the pattern portion in the structure; forming an epitaxial material plug filling the first vertical hole from the substrate by using an epitaxial growth method; forming a first etched portion spaced apart from the epitaxial material plug in the structure; forming first and second horizontal holes extending in the first direction by removing the first and second sacrificial layer patterns exposed by the first etched portion, respectively; forming first and second epitaxial material layers filling each of the first and second horizontal holes by using an epitaxial growth method from a side surface of the epitaxial material plug; removing the first and second insulating layers from the structure; forming a gate insulating material layer on surfaces of the epitaxial material plug and the first epitaxial material layer, and changing the second epitaxial material layer into a separation insulating layer; defining a transistor including a word line by forming the word line in contact with the gate insulating material layer of a transistor formation region around the epitaxial material plug in the structure; forming a filling insulating layer filling a space surrounding the gate insulating material layer and the isolation insulating layer of a capacitor formation region adjacent to the transistor formation region, and the first etched portion in the structure; forming a second etched portion by etching a portion of the filling insulating layer filled in the first etched portion and a surrounding portion thereof in the capacitor formation region of the structure; forming a recess portion by recessing the first epitaxial material layer, the gate insulating material layer, and the filling insulating layer exposed by the second etched portion in the capacitor formation region; forming a capacitor connected to one end of the first epitaxial material layer corresponding to a channel of the transistor in the capacitor formation region; and forming a second vertical hole by etching the epitaxial material plug, and forming a bit line connected to the other end of the first epitaxial material layer corresponding to the channel of the transistor in the second vertical hole.

The first and second insulating layers may include a silicon nitride, and the first and second sacrificial layers may include a silicon oxide.

The insulating material may have a material composition different from the first and second insulating layers and the first and second sacrificial layers.

The second sacrificial layer may have a thinner thickness than that of the first sacrificial layer.

The epitaxial material plug and the first and second epitaxial material layers may include a single crystal semiconductor.

The epitaxial material plug and the first and second epitaxial material layers may include any one selected from single crystal Si, single crystal Ge, and single crystal SiGe.

The forming the gate insulating material layer on the surfaces of the epitaxial material plug and the first epitaxial material layer, and changing the second epitaxial material layer into the separation insulating layer may include performing an oxidation process for the epitaxial material plug and the first and second epitaxial material layers, and the entire second epitaxial material layer may be oxidized by the oxidation process.

The patterned stack may be formed to include a plurality of the pattern portions spaced apart from each other in the second direction and a pattern connection portion connecting the plurality of pattern portions in the second direction.

The word line may include a gate unit structure formed to correspond to the first epitaxial material layer of the transistor formation region, and a plurality of the gate unit structures may be arranged to be spaced apart from each other in the second direction, may further include a connection line portion connecting the plurality of gate unit structures in the second direction, and the connection line portion may be formed at a position corresponding to the pattern connection portion.

The word line may have a dual gate structure.

The first etched portion may have a vertical hole structure penetrating through the pattern portion in the capacitor formation region.

The second etched portion may have a vertical hole structure penetrating through the filling insulating layer in the capacitor formation region.

The forming the capacitor may include forming an electrode member connected to the one end of the first epitaxial material layer on an inner surface of the recess portion; forming a dielectric layer on the electrode member; and forming a plate electrode on the dielectric layer.

After forming the electrode member, exposing an outer surface of the electrode member by recessing the separation insulating layer in the capacitor formation region may be further included, and wherein the dielectric layer and the plate electrode may be formed sequentially after exposing the outer surface of the electrode member.

The first insulating layer, the first sacrificial layer, the second insulating layer, and the second sacrificial layer may constitute one unit stack, and in the forming the stack, the unit stack may be stacked repeatedly on the substrate.

The transistor may be a first transistor, the capacitor may be a first capacitor, and the memory device may be formed to further include a second transistor disposed above the first transistor and a second capacitor disposed above the first capacitor.

According to another embodiment of the present invention, there is provided a manufacturing method of a memory device comprising: forming a structure including an epitaxial material plug extending vertically on a substrate, an epitaxial material layer extending horizontally from a side surface of the epitaxial material plug, and a gate insulating material layer formed at least on a surface of the epitaxial material layer; defining a transistor including a word line by forming the word line in contact with the gate insulating material layer in a transistor formation region around the epitaxial material plug in the structure; removing the epitaxial material layer and the gate insulating material layer from a capacitor formation region adjacent to the transistor formation region of the structure, and forming a capacitor connected to one end of the epitaxial material layer corresponding to a channel of the transistor; and forming a vertical hole by etching the epitaxial material plug, and forming a bit line connected to the other end of the epitaxial material layer corresponding to the channel of the transistor in the vertical hole.

According to another embodiment of the present invention, there is provided a memory device comprising: a plurality of memory cells stacked in a vertical direction, wherein each of the plurality of memory cells includes a transistor and a capacitor electrically connected to a lateral side of the transistor, wherein the transistor includes an epitaxial material layer corresponding to a channel, a word line disposed to face the epitaxial material layer, and a gate insulating layer disposed therebetween, wherein the capacitor includes an electrode member electrically connected to the transistor, a dielectric layer disposed on a surface of the electrode member, and a plate electrode disposed on a surface of the dielectric layer; wherein the memory device includes a bit line being connected to a plurality of transistors of the plurality of memory cells and extending in a vertical direction, and wherein the word line includes a plurality of gate unit structures spaced apart from each other and a connection line portion connecting the plurality of gate unit structures.

For example, the epitaxial material layer may include any one selected from single crystal Si, single crystal Ge, and single crystal SiGe.

The plurality of gate unit structures may be disposed between the plurality of bit lines and the plurality of capacitors, and the connection line portion may have a narrower width than that of each of the plurality of gate unit structures and may be arranged to connect the plurality of gate unit structures to an extension direction of the word line.

The plurality of gate unit structures may be disposed on both sides of the bit line, and the connection line portion may be disposed on both sides of the bit line.

The gate insulating layer may be provided to extend between the word line and the bit line.

A filling insulating layer may be provided between each of the plurality of gate unit structures and the electrode member corresponding thereto.

An insulating material layer which is a separate material layer from the filling insulating layer may be provided between the plurality of gate unit structures.

The memory device may further include an epitaxial material plug in contact with a portion of a side surface of the bit line.

Advantageous Effects

According to embodiments of the present invention, it is possible to implement a memory device (stack-type memory device) and a manufacturing method thereof which may increase the degree of integration and ensure excellent performance, while also enabling easy processing and low manufacturing costs. In addition, according to embodiments of the present invention, it is possible to implement a memory device (stack-type memory device) and a manufacturing method thereof which may improve performance such as mobility by using a single crystal channel material and may easily maximize the height of the capacitor. In particular, according to one embodiment of the present invention, when compared to the existing method using a Si/SiGe stacked structure, it is possible to manufacture a memory device which may lower the process difficulties, reduce manufacturing costs and have improved performance by forming an epitaxial material layer (epitaxial channel layer) according to the SEG (selective epitaxial growth) method using a stack of an insulating layer and a sacrificial layer. According to one example, the memory device may be configured to include a horizontal stack-type DRAM device.

However, the effects of the present invention are not limited to the above effects and may be expanded in various ways without departing from the technological spirit and scope of the present invention.

BRIEF DESCRIPTION OF THE DRAWINGS

FIGS. 23A and 23B are diagrams for explaining a memory device according to an embodiment of the present invention.

BEST MODE FOR CARRYING OUT THE INVENTION

Figure 1A:
FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, and 23A are cross-sectional diagrams for explaining an example of a manufacturing method of a memory device according to an embodiment of the present invention.

Hereinafter, embodiments of the present invention will be described in detail with reference to the accompanying drawings.

The embodiments of the present invention to be described below are provided to more clearly explain the present invention to those skilled in the art, and the scope of the present invention is not limited by the following embodiments, and the embodiments may be modified in many different forms.

The terms used in this specification are used to describe specific embodiments and are not intended to limit the present invention. The terms indicating a singular form used herein may include plural forms unless the context clearly indicates otherwise. Also, as used herein, the terms, "comprise" and/or "comprising" specify the presence of the stated shape, step, number, operation, member, element, and/or group thereof and does not exclude the presence or addition of one or more other shapes, steps, numbers, operations, elements, elements and/or groups thereof. In addition, the term, "connection" used in this specification means not only a direct connection of certain members, but also a concept including an indirect connection in which other members are interposed between the members.

In addition, in the description of this specification, the descriptions such as "first" and "second", "upper or top", and "lower or bottom" are intended to distinguish members, and not used to limit the members themselves or mean a specific order, but rather a relative positional relationship among them, and does not limit specific cases where the other members are directly contacted with the described configuring members or another member is introduced into the interface between them. The same interpretation may be applied to other expressions which describe relationships between the configuring components.

In addition, in the present specification, when a member is said to be located "on" another member, this arrangement includes not only a case in which a member is in contact with another member, but also a case where another member exists between the two members. As used herein, the term, "and/of" includes any one and all combinations of one or more of the listed items. In addition, the terms of degree such as "about" and "substantially" used in the present specification are used as a range of values or degrees, or as a meaning close thereto, taking into account inherent manufacturing and substance tolerances, and exact or absolute figures provided to aid in the understanding of this application are used to prevent the infringers from unfairly exploiting the stated disclosure.

Hereinafter, embodiments of the present invention will be described in detail with reference to the accompanying drawings. A size or a thickness of areas or parts shown in the accompanying drawings may be slightly exaggerated for clarity of the specification and convenience of description. The same reference numbers indicate the same configuring elements throughout the detailed description.

FIG. 1A to FIG. 23B are diagrams for explaining an example of a manufacturing method of a memory device (stack-type memory device) according to an embodiment of the present invention.

The same numbers in FIGS. 1A-23B (e.g., FIG. 1 in FIGS. 1A, 1B, and 1C) refer to the same steps. FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, and 23A are cross-sectional views cut along the XZ plane. FIGS. 1B, 2B, 3B, 4B, 5B, 6B, 7B, 8B, 9B, 10B, 11B, 12B, 13B, 14B, 15B, 16B, 17B, 18B, 19B, 20B, 21B, 22B, and 23B are plan views viewed from above (i.e., top-view) or cross-sectional views cut along the XY plane (i.e., Z-cut view). FIGS. 1C, 2C, 3C, 4C, 5C, 6C, and 7C are cross-sectional views cut along the YZ plane.

Figure 1B:
FIGS. 1B, 2B, 3B, 4B, 5B, 6B, 7B, 8B, 9B, 10B, 11B, 12B, 13B, 14B, 15B, 16B, 17B, 18B, 19B, 20B, 21B, 22B, and 23B are diagrams for explaining an example of a manufacturing method of a memory device according to an embodiment of the present invention.
Figure 1C:
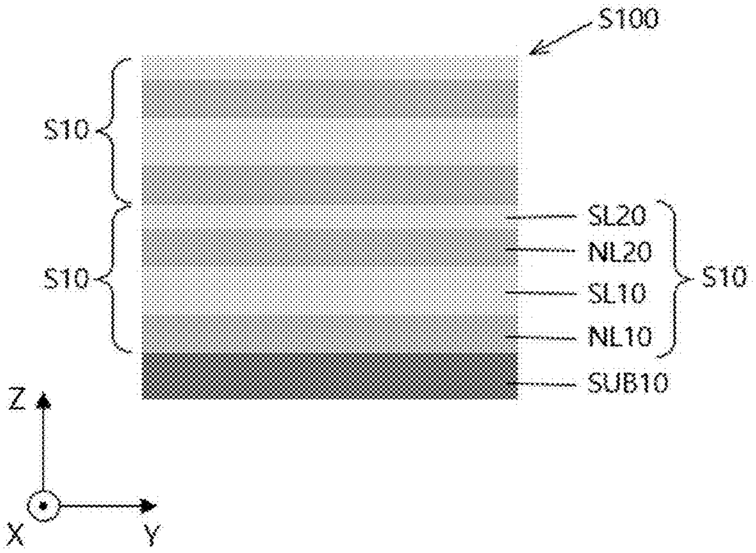
FIGS. 1C, 2C, 3C, 4C, 5C, 6C, and 7C are cross-sectional diagrams for explaining an example of a manufacturing method of a memory device according to an embodiment of the present invention.

Referring to FIGS. 1A to 1C, a stack S100 may be formed on a substrate SUB10. The material of the substrate SUB10 may be selected from a variety of materials. The substrate SUB10 may include a semiconductor material. The substrate SUB10 may include a semiconductor wafer. The substrate SUB10 may include a bulk silicon substrate, a silicon-on-insulator (SOI) substrate, a germanium substrate, and a germanium-on-insulator (GOI) substrate, a silicon-germanium substrate, or a substrate formed through an epitaxial growth process. The substrate SUB10 may include a single crystal semiconductor material. For example, the substrate SUB10 may include any one selected from a single crystal silicon (Si), a single crystal germanium (Ge), and a single crystal silicon-germanium (SiGe).

The stack S100 may be formed on the substrate SUB10. The stack S100 may include a first insulating layer NL10, a first sacrificial layer SL10, a second insulating layer NL20, and a second sacrificial layer SL20, which are sequentially stacked. As a non-limiting example, the first insulating layer NL10 and the second insulating layer NL20 may include a silicon nitride (e.g., SiNx) or may be formed by a silicon nitride (e.g., SiNx). As a non-limiting example, the first sacrificial layer SL10 and the second sacrificial layer SL20 may include a silicon oxide (e.g., SiO2) or may be formed by a silicon oxide (e.g., SiO2). The first sacrificial layer SL10 and the second sacrificial layer SL20 may have an etching selectivity with respect to the first insulating layer NL10 and the second insulating layer NL20. The first insulating layer NL10, the first sacrificial layer SL10, the second insulating layer NL20, and the second sacrificial layer SL20 may be formed through a deposition process.

According to one embodiment, the second sacrificial layer SL20 may have a thinner thickness than that of the first sacrificial layer SL10. The first sacrificial layer SL10 may be a relatively thick layer, and the second sacrificial layer SL20 may be a relatively thin layer. For example, the first sacrificial layer SL10 may have a thickness which is about 1.5 times or more or about 2 times more than that of the second sacrificial layer SL20. A separation layer (a separation insulating layer) which separates an upper cell and a lower cell to be formed later may be easily formed by making the thickness of the second sacrificial layer SL20 relatively smaller than the thickness of the first sacrificial layer SL10. The first insulating layer NL10 and the second insulating layer NL20 may have the same thickness or substantially the same thickness.

In addition, according to one embodiment, the first insulating layer NL10, the first sacrificial layer SL10, the second insulating layer NL20, and the second sacrificial layer SL20 may form one unit stack S10. In the step for forming the stack S100, the unit stack S10 may be repeatedly stacked on the substrate SUB10. Accordingly, the stack S100 may include a plurality of unit stacks S10 which are repeatedly stacked. FIG. 1A and FIG. 1C illustrate a case in which two-unit stacks S10 are stacked on a substrate SUB10, but the number of unit stack S10 stacked may be two or more.

Figure 2A:
Figure 2B:
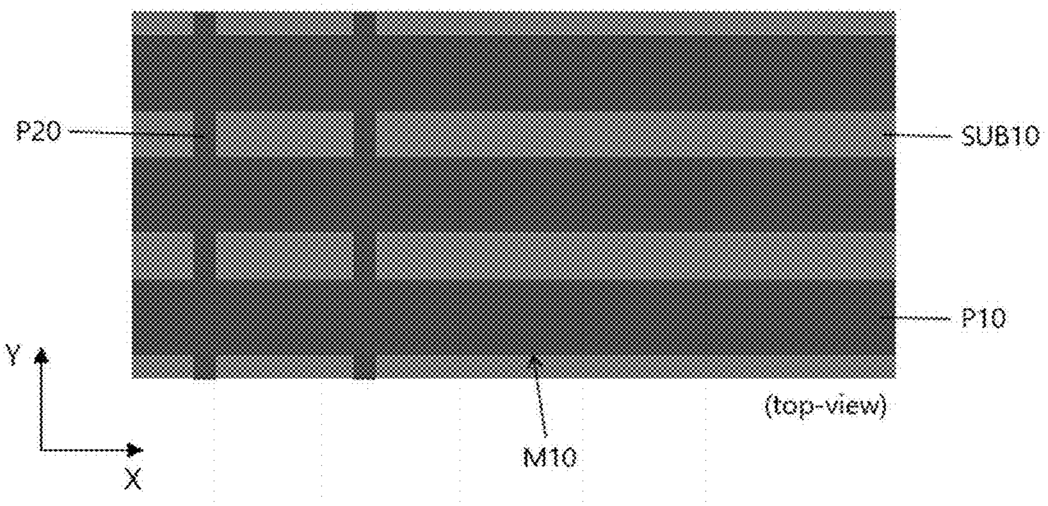
Figure 2C:
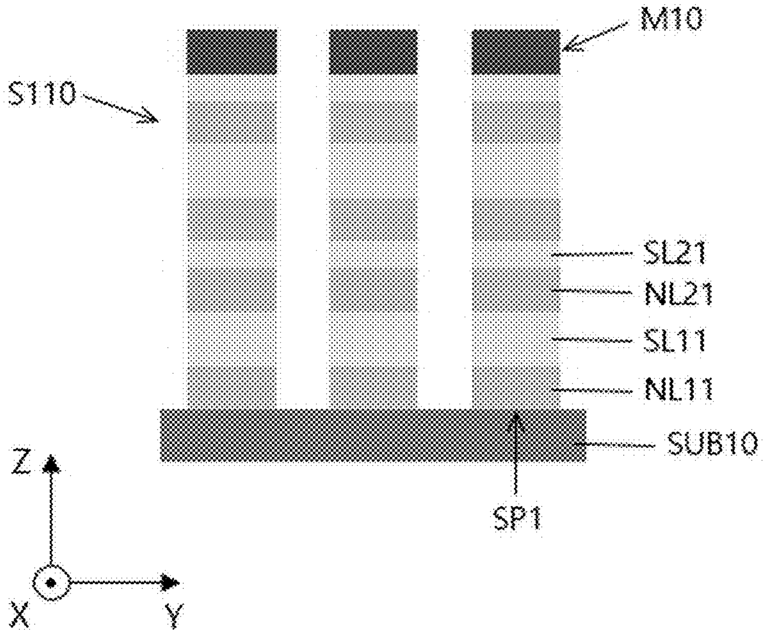

Referring to FIGS. 2A to 2C, the stack (S100 in FIG. 1A) may be patterned to form a patterned stack S110 having at least one pattern portion SP1. The pattern portion SP1 may have a shape extending in a first direction, for example, the X-axis direction, and etched regions (etched empty regions) may be provided on both sides of the pattern portion SP1 along a second direction perpendicular to the first direction, for example, the Y-axis direction. The plurality of pattern portions SP1 may be spaced apart in the Y-axis direction and arranged side by side in the X-axis direction. This step may be a patterning step for separation between cells.

The pattern portion SP1 may include a patterned first insulating layer NL11, a patterned first sacrificial layer SL11, a patterned second insulating layer NL21, and a patterned second sacrificial layer SL21. Here, the patterned first sacrificial layer SL11 may be referred to as the first sacrificial layer pattern SL11 obtained from the first sacrificial layer (SL10 in FIG. 1A). Also, the patterned second sacrificial layer SL21 may be referred to as the second sacrificial layer pattern SL21 obtained from the second sacrificial layer (SL20 in FIG. 1A). The plurality of first sacrificial layer patterns SL11 may be spaced apart from each other in the Y-axis direction and extend parallel to each other in the X-axis direction. Similarly, the plurality of second sacrificial layer patterns SL21 may be spaced apart from each other in the Y-axis direction, and thus, they may extend parallel to each other in the X-axis direction. Each of the first sacrificial layer patterns SL11 and the second sacrificial layer patterns SL21 may have a line shape.

The first mask pattern M10 disposed on the stack (S100 in FIG. 1A) may be used for the patterning process of FIGS. 2A to 2C. The first mask pattern M10 may have a predetermined pattern structure. The first mask pattern M10 may be, for example, a photoresist pattern. After the patterning process, the first mask pattern M10 may be removed.

According to one embodiment, the patterned stack S110 may be formed to include a plurality of pattern portions SP1 spaced apart from each other in the second direction (e.g., Y-axis direction) and a 'pattern connection portion' connecting the plurality of pattern portions SP1 in the second direction (e.g., Y-axis direction). For this purpose, as shown in FIG. 2B, the first mask pattern M10 may include a plurality of first mask portions P10 spaced apart from each other in the second direction (e.g., Y-axis direction) and a second mask portion P20 for connection which is used to connect the plurality of first mask portions P10 in the second direction (e.g., Y-axis direction). The plurality of first mask portions P10 may have a shape (a type of line shape) extending in the first direction (e.g., X-axis direction), and the second mask portion P20 for connection may have a shape (a type of line shape) extending in the second direction (e.g., Y-axis direction). The second mask portion P20 for connection may be arranged to form a plurality of lines, and may be arranged to form two lines in the drawing. The plurality of pattern portions SP1 of the patterned stack S110 may be formed to correspond to the plurality of first mask portions P10, and the pattern connection portion of the patterned stack S110 may be formed to correspond to the second mask portion P20 for connection. The pattern connection portion of the patterned stack S110 may be a part for forming a word line connection portion (a connection line portion) later.

Figure 3A:
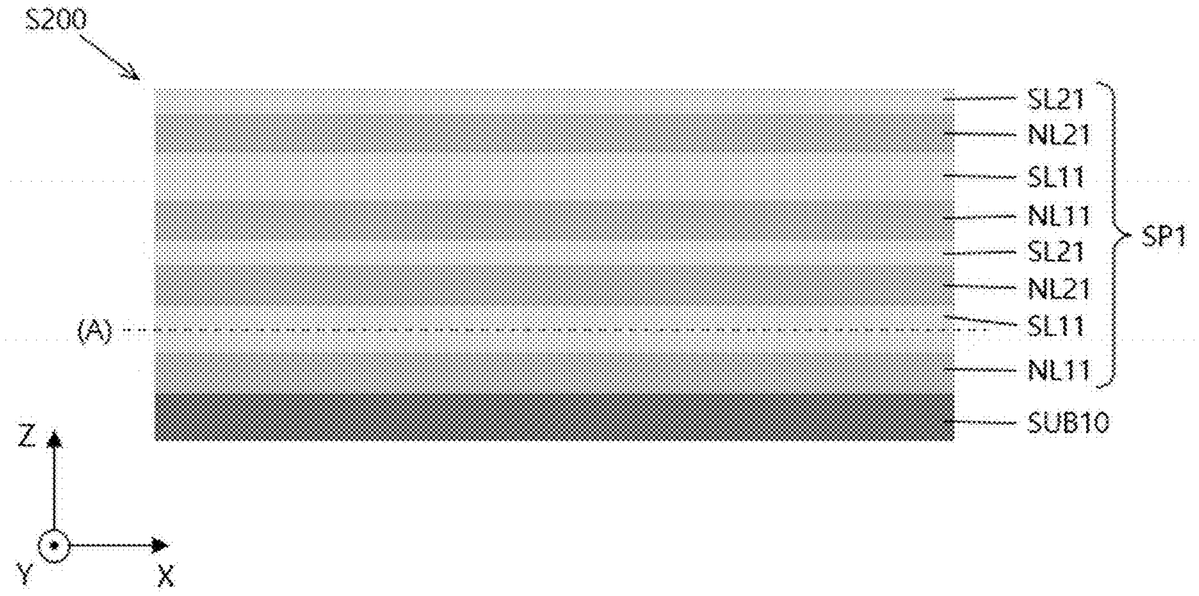
Figure 3B:
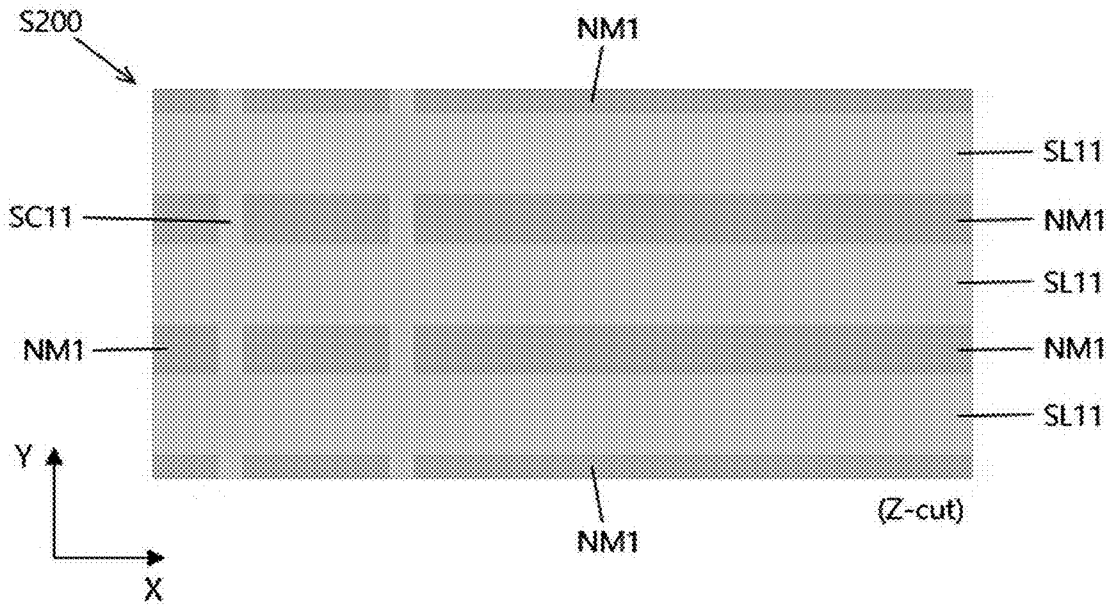
Figure 3C:
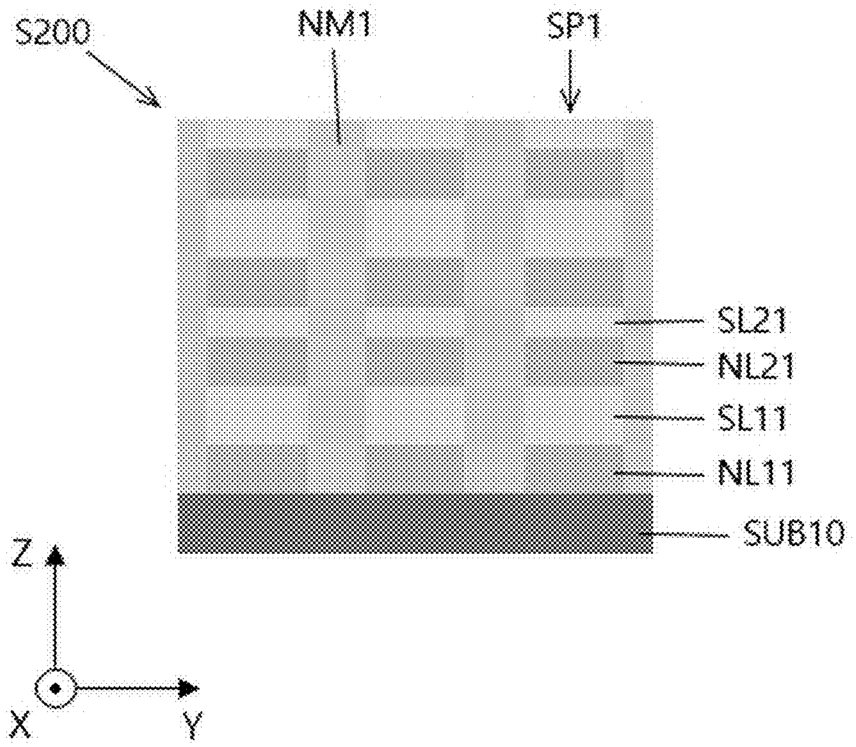

Referring to FIGS. 3A to 3C, a structure S200 including the patterned stack (S110 in FIG. 2A) and an insulating material NM1 may be formed by filling the etched regions (etched empty regions) on both sides of at least one pattern portion SP1 with the insulating material NM1. Here, FIG. 3B may be a cross-sectional view taken along line (A) of FIG. 3A.

The insulating material NM1 may be referred to as an 'insulating material layer' or an 'insulating material layer pattern', and may have the same (or substantially the same) height as the pattern portion SP1. The insulating material NM1 may have a material composition different from those of the first and second insulating layers (i.e., first and second insulating layer patterns) NL11 and NL21 and the first and second sacrificial layer patterns SL11 and SL21. In other words, the insulating material NM1 may have a material composition different from those of the first and second insulating layers NL10 and NL20 and the first and second sacrificial layers SL10 and SL20 of FIG. 1A. The first and second insulating layers NL11 and NL21 may have an etching selectivity with respect to the insulating material NM1, and the first and second sacrificial layer patterns SLi1 and SL21 may have an etching selectivity with respect to the insulating material NM1.

In FIG. 3B, reference number SC11 indicates a first sacrificial layer pattern connection portion (a type of extended portion) corresponding to the 'pattern connection portion' described above.

Figure 4A:
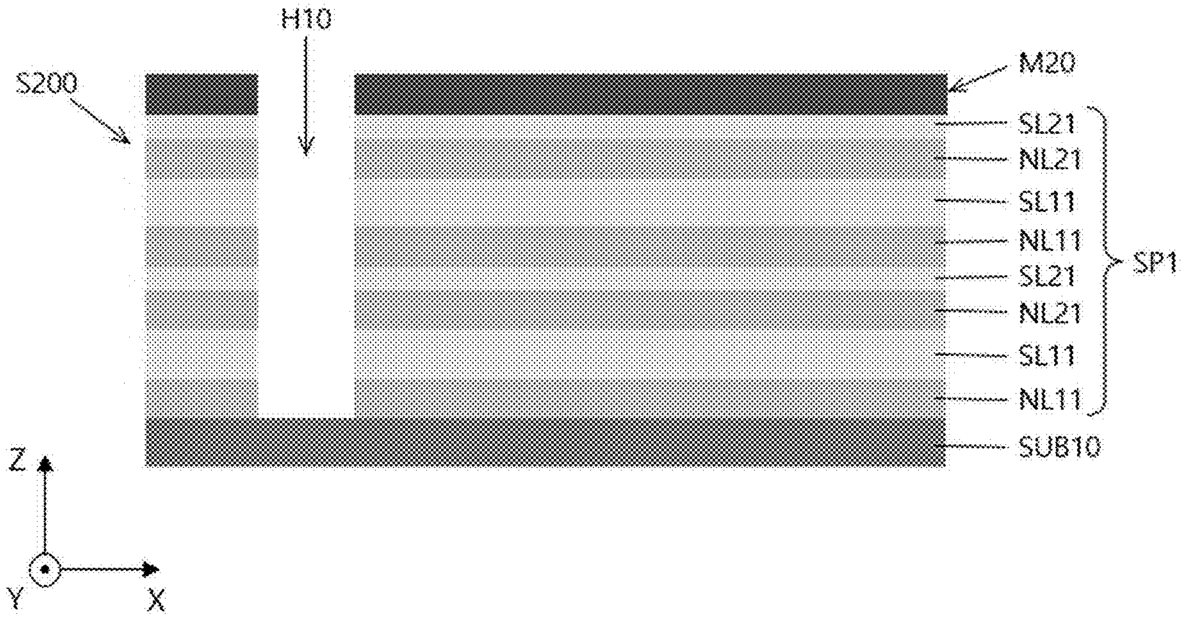
Figure 4B:
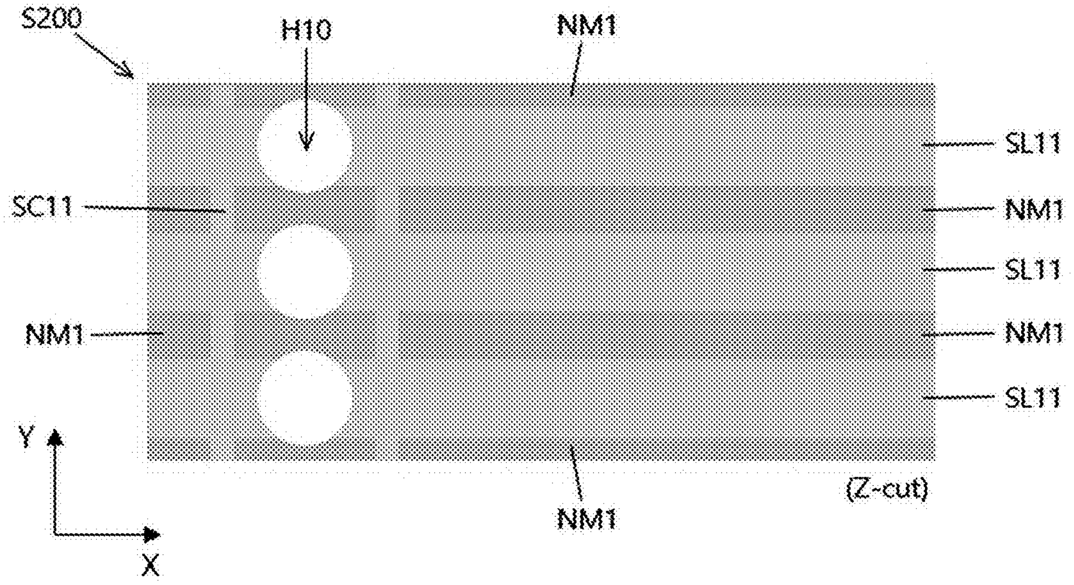
Figure 4C:
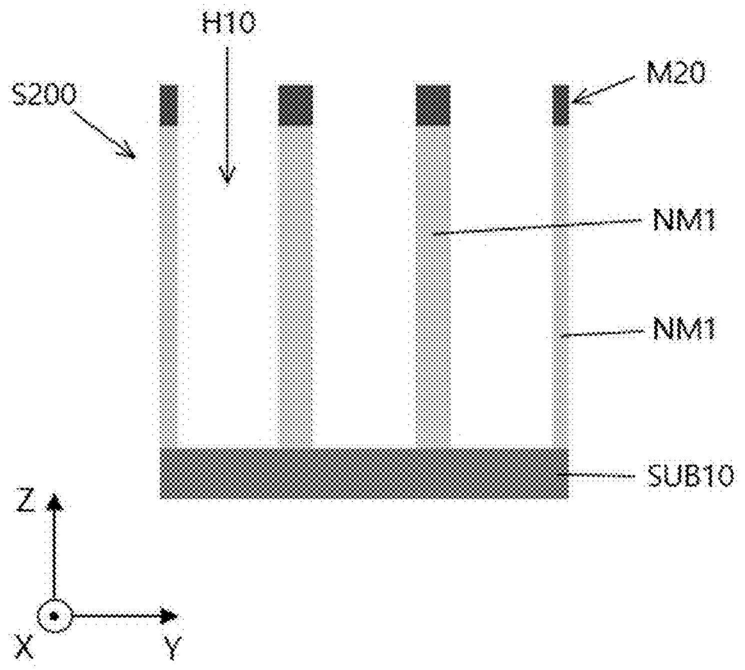

Referring to FIG. 4A to FIG. 4C, a first vertical hole H10 penetrating through the first and second sacrificial layer patterns SL11 and SL21 of the pattern portion SP1 may be formed in the structure S200. The first vertical hole H10 may be formed to penetrate from the second sacrificial layer pattern SL21 at the uppermost part of the pattern portion SP1 to the first insulating layer NL11 at the lowermost part in a predetermined area of the structure S200. The first vertical hole H10 may correspond to a region where a bit line will be formed later. The first vertical hole H10 may be formed in a region of the structure S200 where a transistor is to be formed, that is, a transistor formation region (a transistor formation planned region). A plurality of first vertical holes H10 may be formed to be spaced apart from each other in the Y-axis direction. As the first vertical hole H10 is formed, side surfaces of the first sacrificial layer pattern SL11 and the second sacrificial layer pattern SL21 may be exposed.

According to one embodiment, the 'pattern connection portion' may be arranged to form two adjacent lines, and the first vertical hole H10 may be formed between the two lines.

The second mask pattern M20 may be used to form the first vertical hole H10. The second mask pattern M20 may have a predetermined opening pattern. The second mask pattern M20 may be, for example, a photoresist pattern. After forming the first vertical hole H10, the second mask pattern M20 may be removed.

Figure 5A:
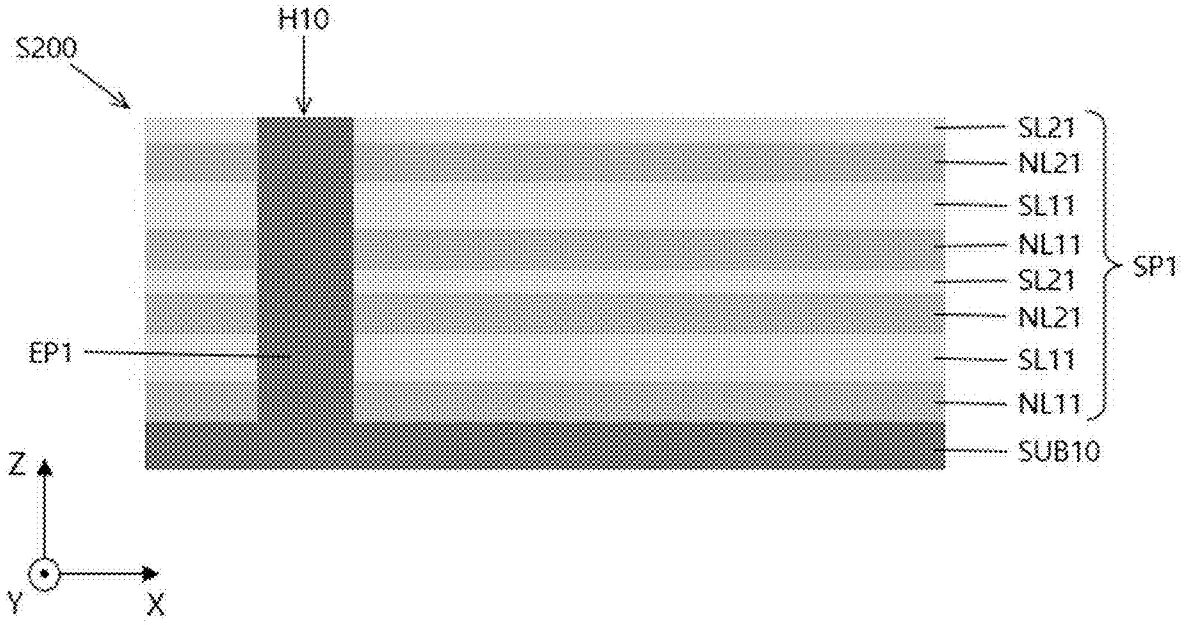
Figure 5B:
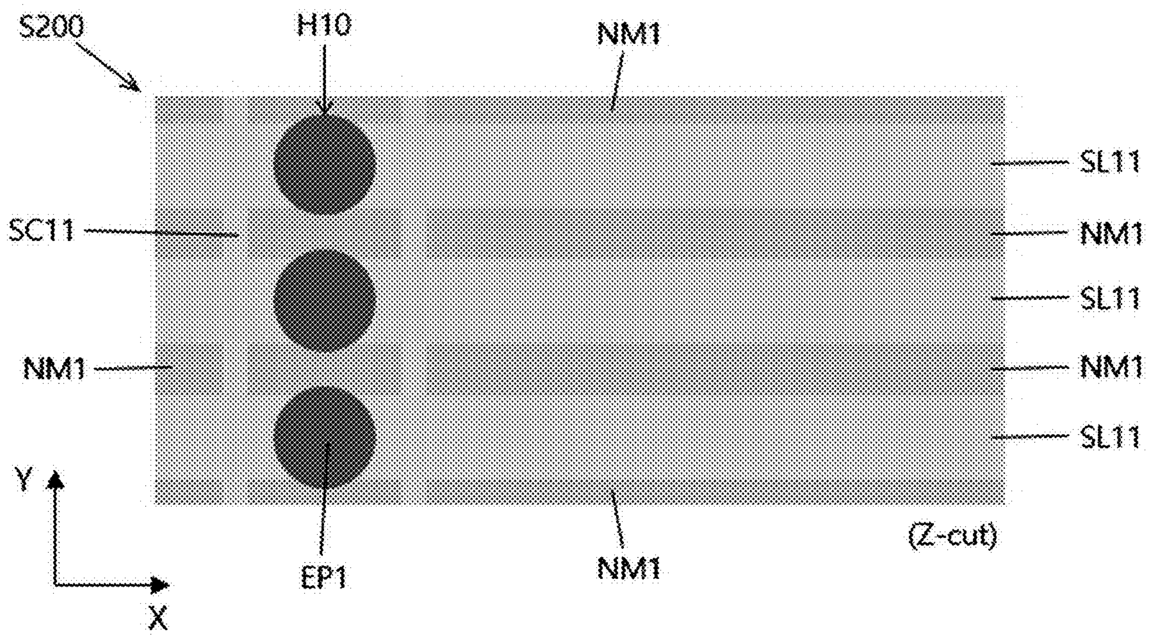
Figure 5C:
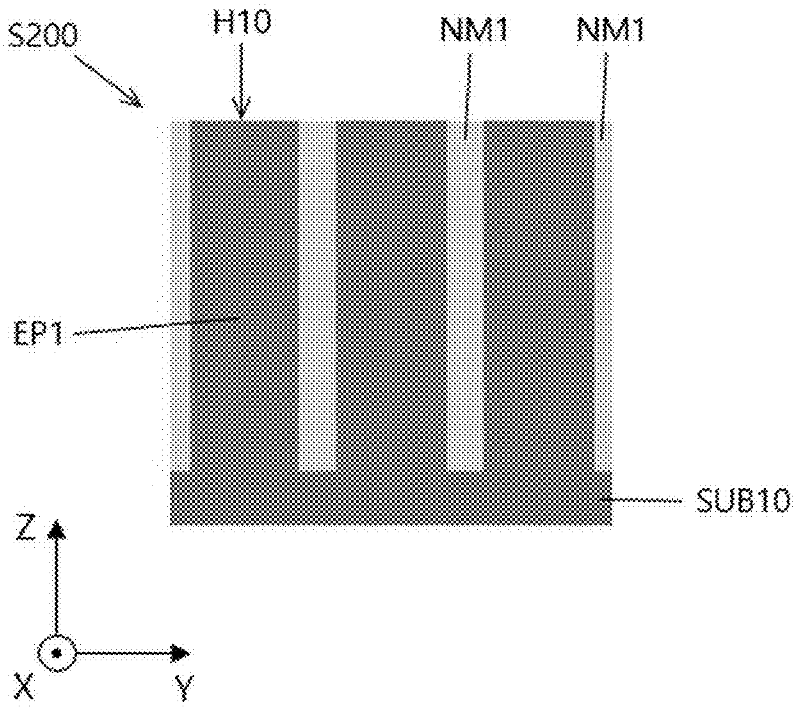

Referring to FIGS. 5A to 5C, an epitaxial material plug EP1 filling the first vertical hole H10 may be formed from the substrate SUB10 by using an epitaxial growth method. The epitaxial material plug EP1 filling the first vertical hole H10 may be formed from the upper surface portion of the substrate SUB10 exposed by the first vertical hole H10 by using an epitaxial growth process. Therefore, the epitaxial growth method may be called a selective epitaxial growth (SEG) method.

The epitaxial material plug EP1 may include a single crystal semiconductor. For example, the epitaxial material plug EP1 may include single crystal Si. The epitaxial material plug EP1 may be composed of single crystal Si. However, the material of the epitaxial material plug EP1 is not limited to single crystal Si. In some cases, the epitaxial material plug EP1 may include other materials such as single crystal Ge or single crystal SiGe, or may be composed of the other materials.

Figure 6A:
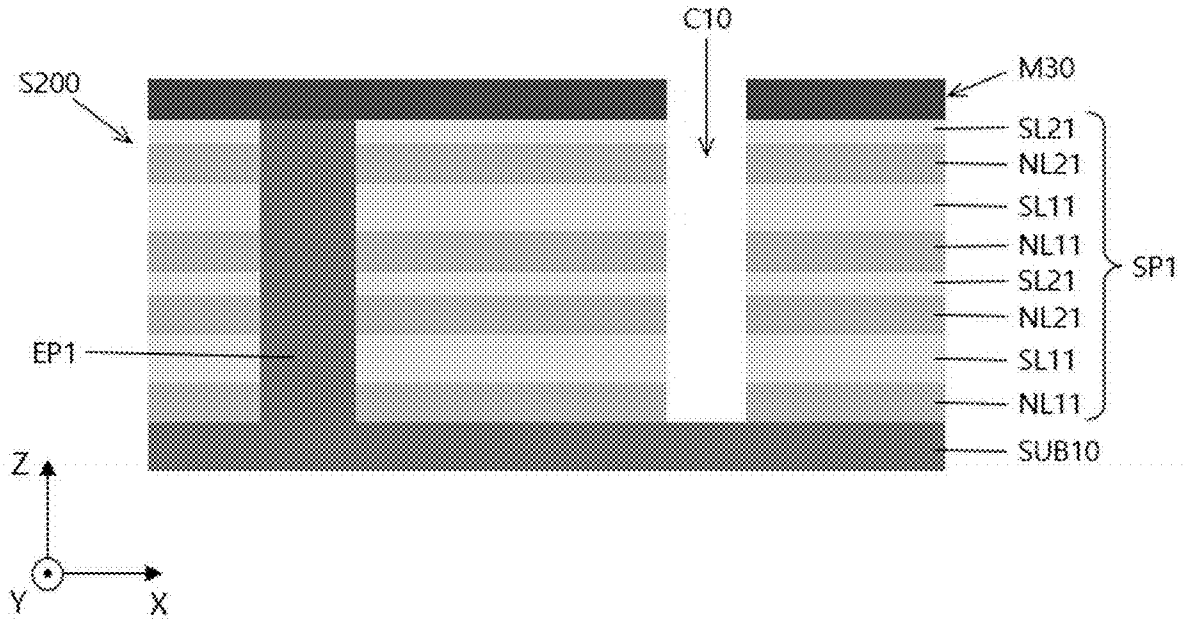
Figure 6B:
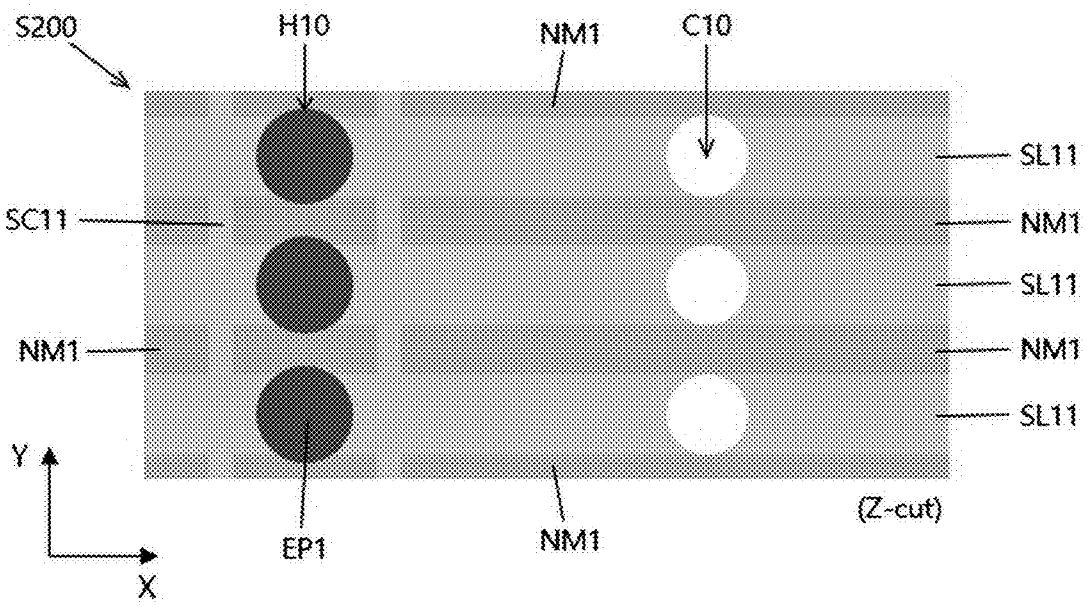
Figure 6C:
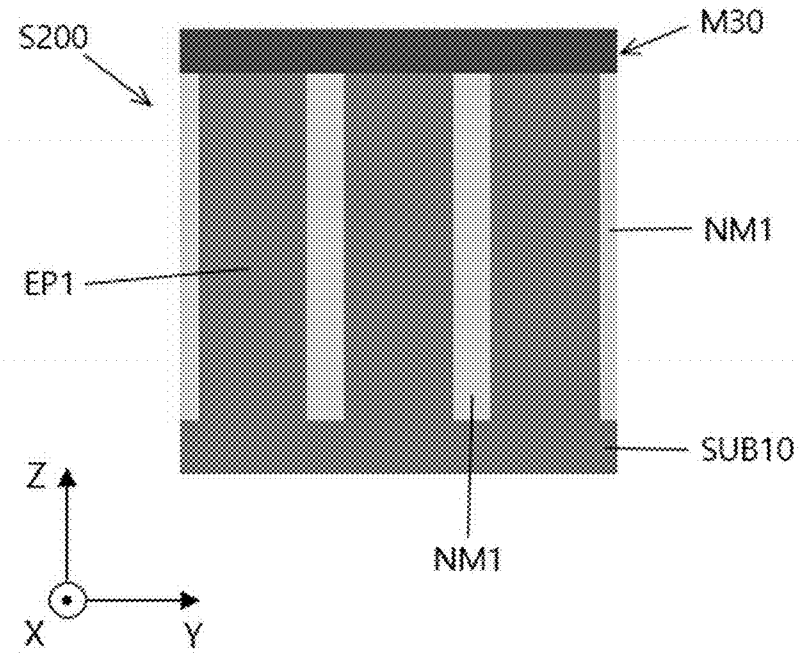

Referring to FIGS. 6A to 6C, a first etched portion C10 spaced apart from the epitaxial material plug EP1 may be formed in the structure S200. The first etched portion C10 may be formed in a capacitor formation region (a region where a capacitor is to be formed) adjacent to the transistor formation region (a region where a transistor is to be formed) in the structure S200. The first etched portion C10 may have a vertical hole structure. The first etched portion C10 may have a vertical hole structure penetrating through the pattern portion SP1 in the capacitor formation region. A plurality of first etched portions C10 penetrating through each of the plurality of pattern portions SP1 may be formed. The first etched portion C10 may be formed to penetrate from the second sacrificial layer pattern SL21 at the uppermost part of the pattern portion SP1 to the first insulating layer NL11 at the lowermost part. The first etched portion C10 may be formed using a dry etching method. The first etched portion C10 may be referred to as a first capacitor region hole.

The third mask pattern M30 may be used to form the first etched portion C10. The third mask pattern M30 may have a predetermined opening area. The third mask pattern M30 may be, for example, a photoresist pattern. After forming the first etched portion C10, the third mask pattern M30 may be removed.

Figure 7A:
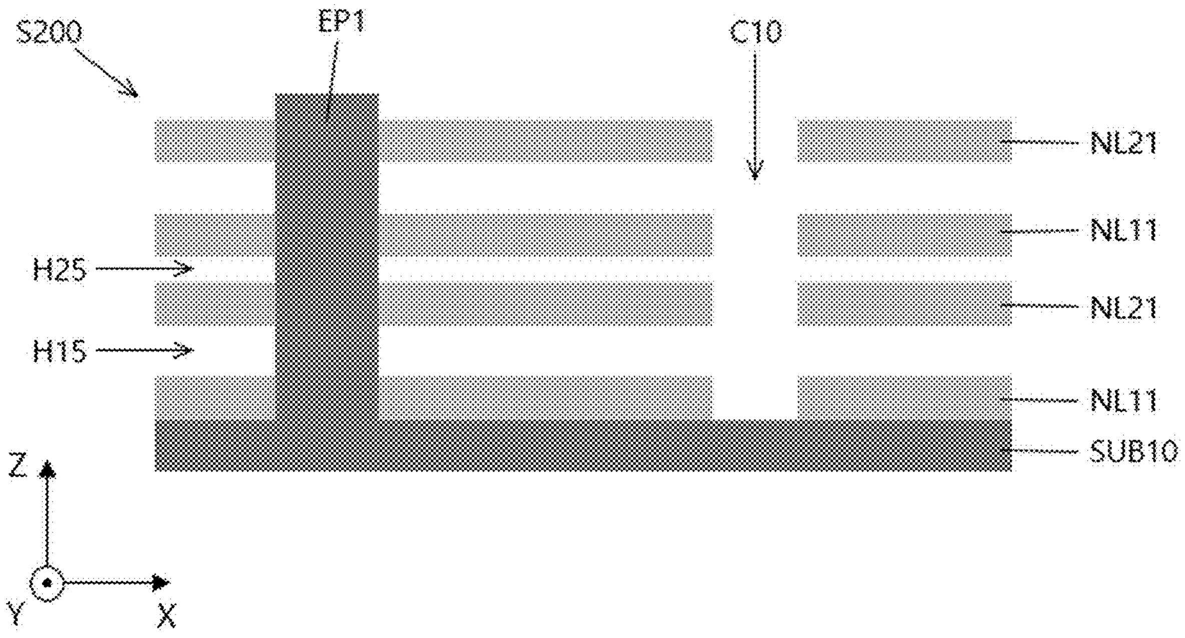
Figure 7B:
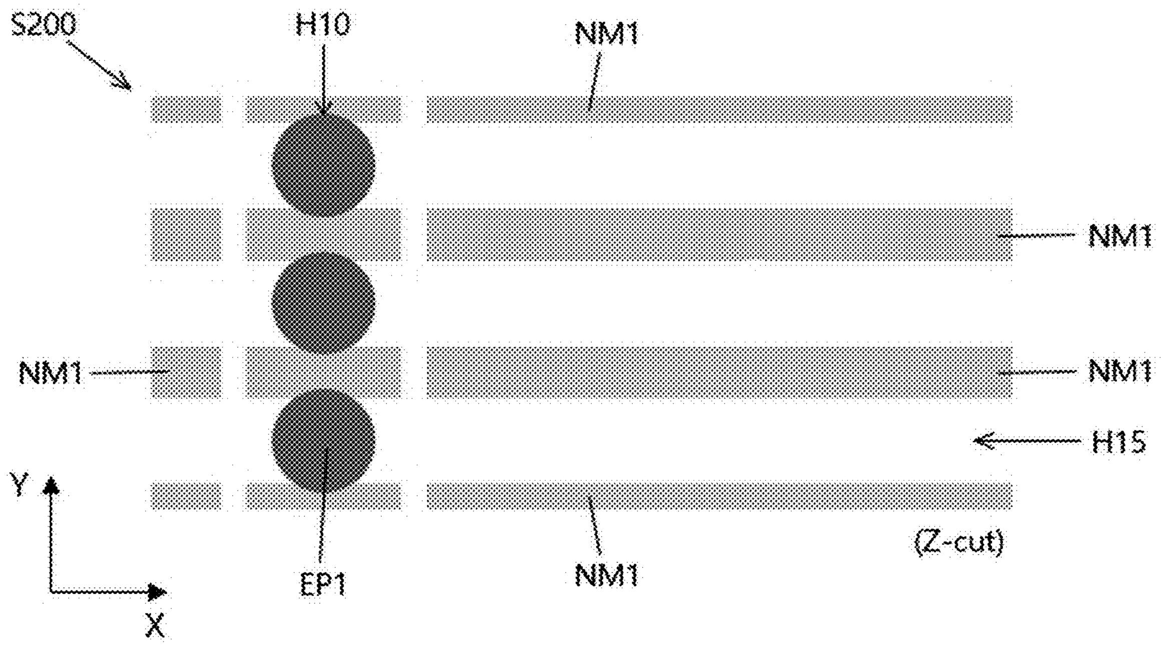
Figure 7C:
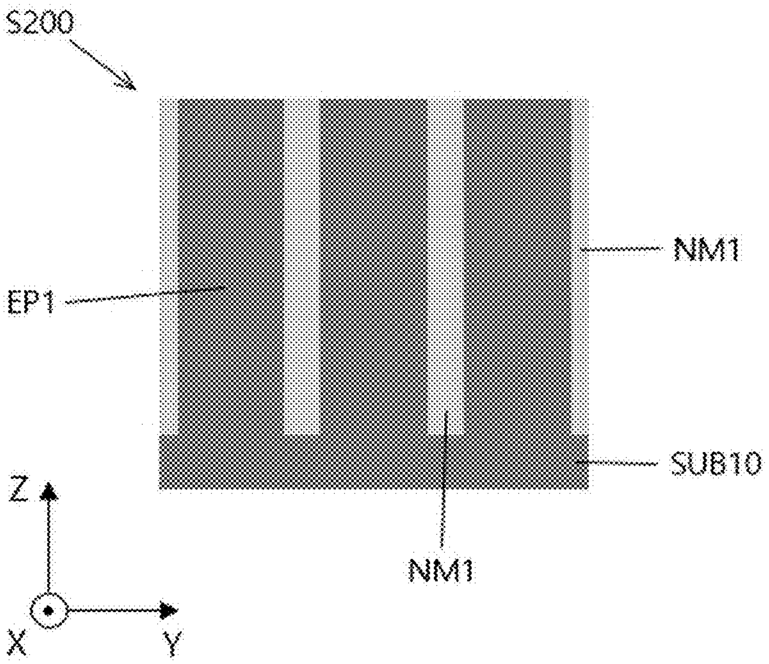

Referring to FIGS. 7A to 7C, first and second horizontal holes H15 and H25 extending in the first direction, for example, the X-axis direction may be formed by removing the first sacrificial layer pattern (SL11 in FIG. 6A) and the second sacrificial layer pattern (SL21 in FIG. 6A) exposed by the first etched portion C10, respectively. The first sacrificial layer pattern (SL11 in FIG. 6A) and the second sacrificial layer pattern (SL21 in FIG. 6A) may be selectively removed by using a wet etching process using a wet etchant having etching selectivity for the first sacrificial layer pattern (SL11 in FIG. 6A) and the second sacrificial layer pattern (SL21 in FIG. 6A). The horizontal hole formed by removing the first sacrificial layer pattern (SL11 in FIG. 6A) may be referred to as the first horizontal hole H15, and the horizontal hole formed by removing the second sacrificial layer pattern (SL21 in FIG. 6A) may be referred to as the second horizontal hole H25. The first and second horizontal holes H15 and H25 may have a line shape extending in the X-axis direction.

In addition, in this step, the first sacrificial layer pattern connection portion (a type of extended portion) and the second sacrificial layer pattern connection portion (a type of extended portion) corresponding to the above-described 'pattern connection portion' may also be removed, and the horizontal holes corresponding to them may be formed.

According to one embodiment, the entire first sacrificial layer pattern (SL11 in FIG. 6A) may be removed in the step for forming the horizontal holes H15 and H25. Also, in the step for forming the horizontal holes H15 and H25, the entire second sacrificial layer pattern (SL21 in FIG. 6A) may be removed. Accordingly, the horizontal holes H15 and H25 may be formed to extend not only to the area where the transistor is to be formed (i.e., the transistor formation region) but also to the area where the capacitor is to be formed (i.e., the capacitor formation region). In this step, when removing the entire first sacrificial layer pattern (SL11 in FIG. 6A) and the entire second sacrificial layer pattern (SL21 in FIG. 6A), in connection with this removing step, an effect that the process is simplified may be obtained.

Figure 8A:
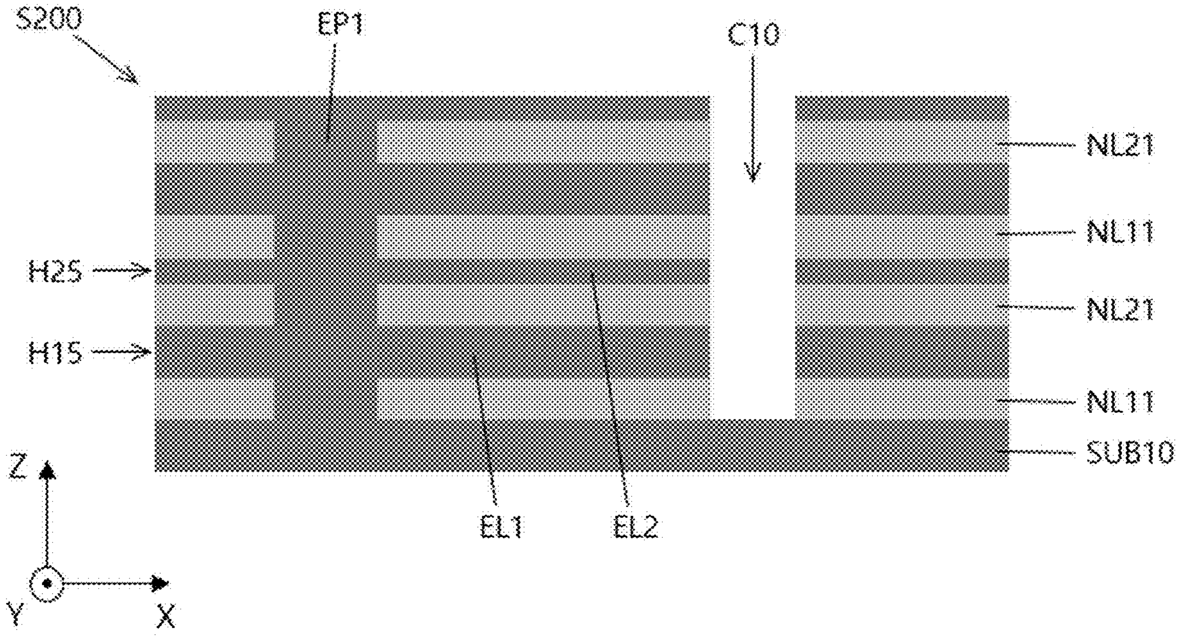
Figure 8B:
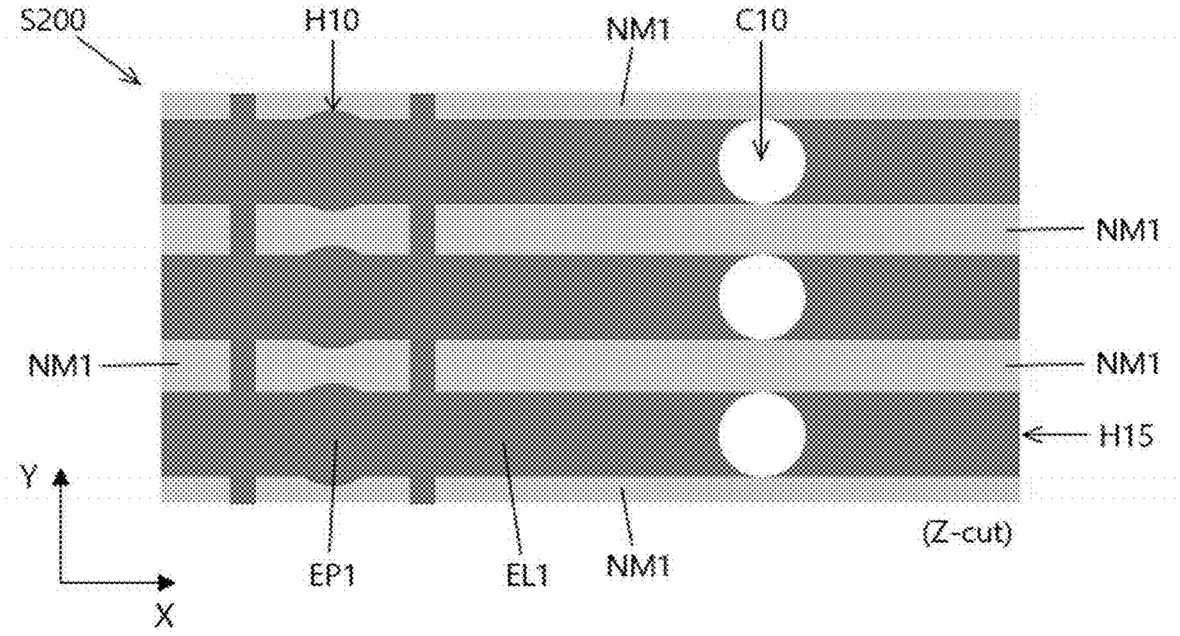

Referring to FIGS. 8A and 8B, first and second epitaxial material layers EL1 and EL2 filling the first and second horizontal holes H15, H25, respectively may be formed from a side surface of the epitaxial material plug EP1 by using an epitaxial growth method. The first and second epitaxial material layers EL1 and EL2 filling the first and second horizontal holes H15, H25, respectively may be formed by using an epitaxial growth process from the side surface portion of the epitaxial material plug EP1 exposed by the first and second horizontal holes H15, H25. Therefore, the epitaxial growth method may be called a selective epitaxial growth (SEG) method. Additionally, in this step, an epitaxial material layer which fills the horizontal holes corresponding to the 'pattern connection portion' described above may be formed.

The first and second epitaxial material layers EL1 and EL2 may include a single crystal semiconductor. For example, the first and second epitaxial material layers EL1 and EL2 may include single crystal Si. The first and second epitaxial material layers EL1 and EL2 may be composed of single crystal Si. However, the material of the first and second epitaxial material layers EL1 and EL2 is not limited to single crystal Si. In some cases, the first and second epitaxial material layers EL1 and EL2 may include other materials such as single crystal Ge or single crystal SiGe, or may be composed of the other materials. Since the first epitaxial material layer EL1 may be composed of a single crystal material, a transistor formed by applying the first epitaxial material layer EL1 may have excellent performance such as high mobility.

Figure 9A:
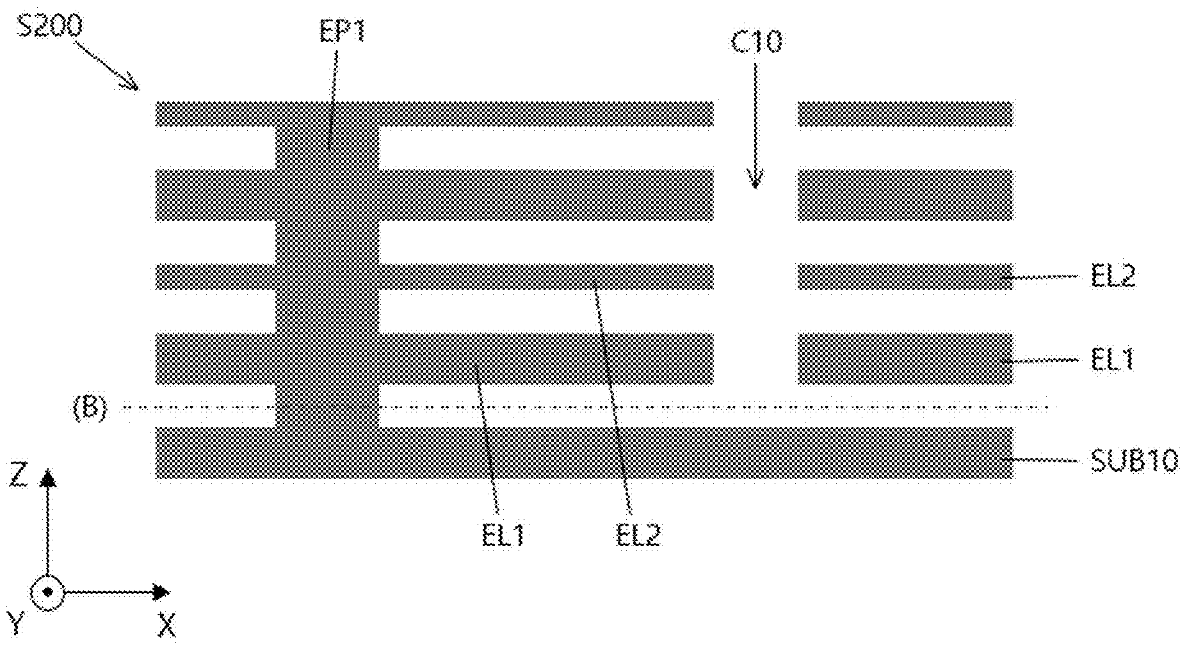
Figure 9B:
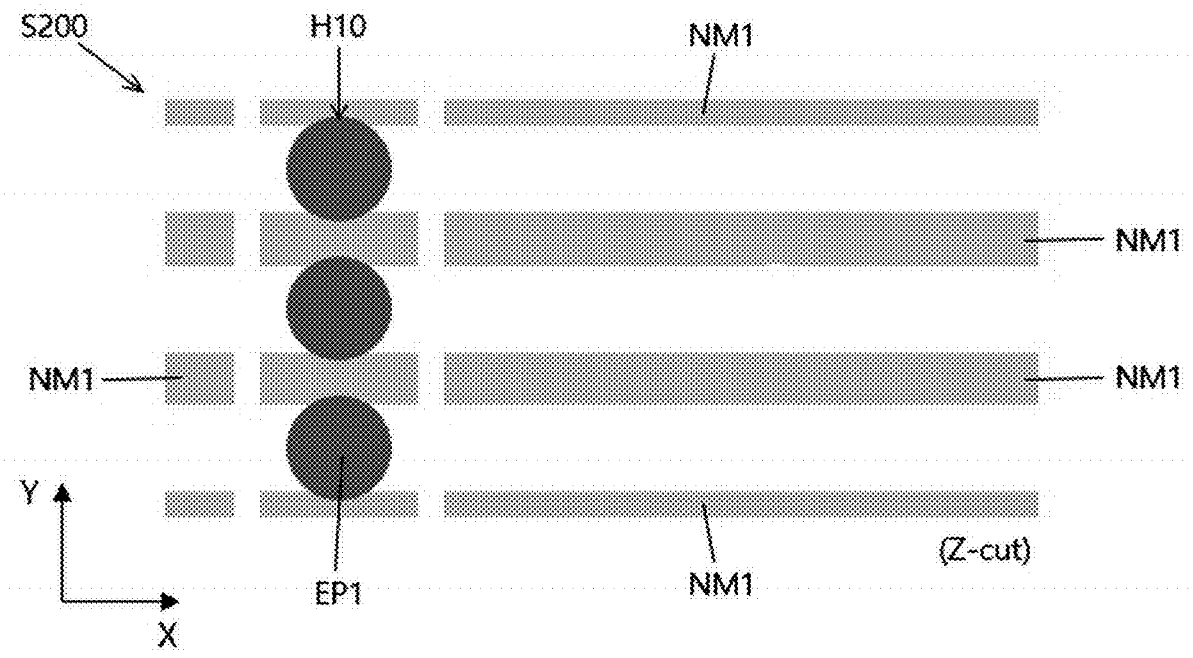

Referring to FIGS. 9A and 9B, an empty space around the epitaxial material plug EP1 and the epitaxial material layers EL1, EL2 may be formed by removing the first and second insulating layers (NL11 and NL21 in FIG. 8A) from the structure S200. The first and second insulating layers (NL11 and NL21 in FIG. 8A) may be selectively removed by using a wet etch process using a wet etchant having etching selectivity for the first and second insulating layers (NL11 and NL21 in FIG. 8A) through the first etched portion C10. The wet etchant may be supplied mainly through the first etched portion C10. At this time, the insulating material NM1 may not be etched or may not be etched at all. FIG. 9B may be a cross-sectional view taken along line (B) of FIG. 9A.

Figure 10A:
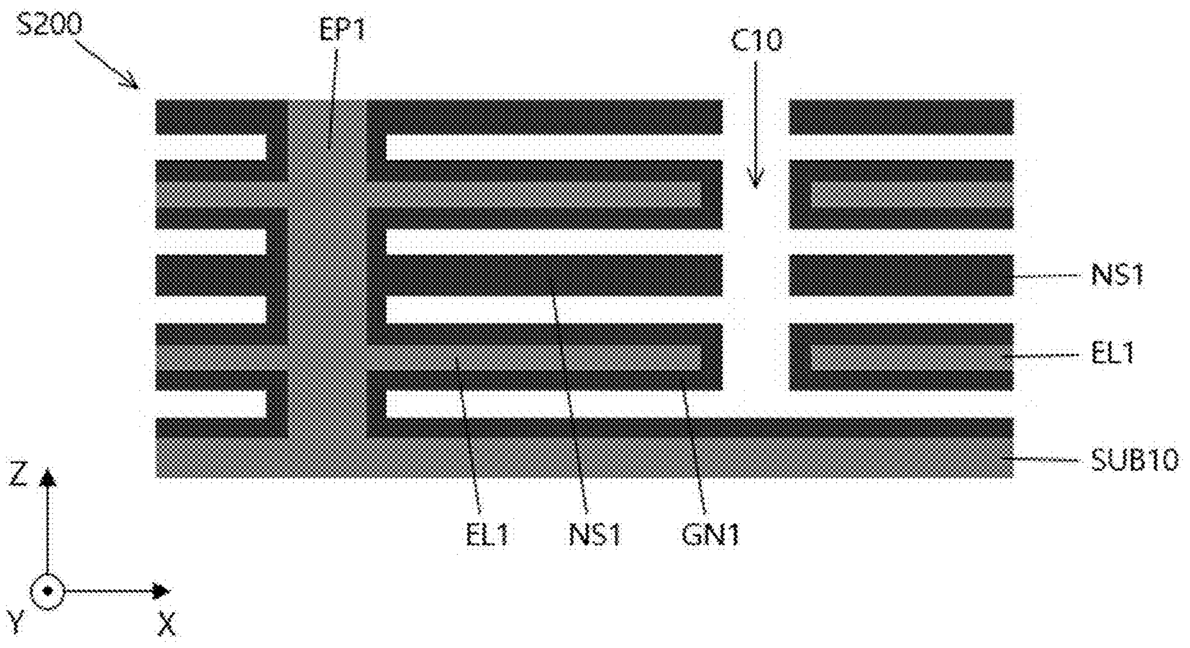
Figure 10B:
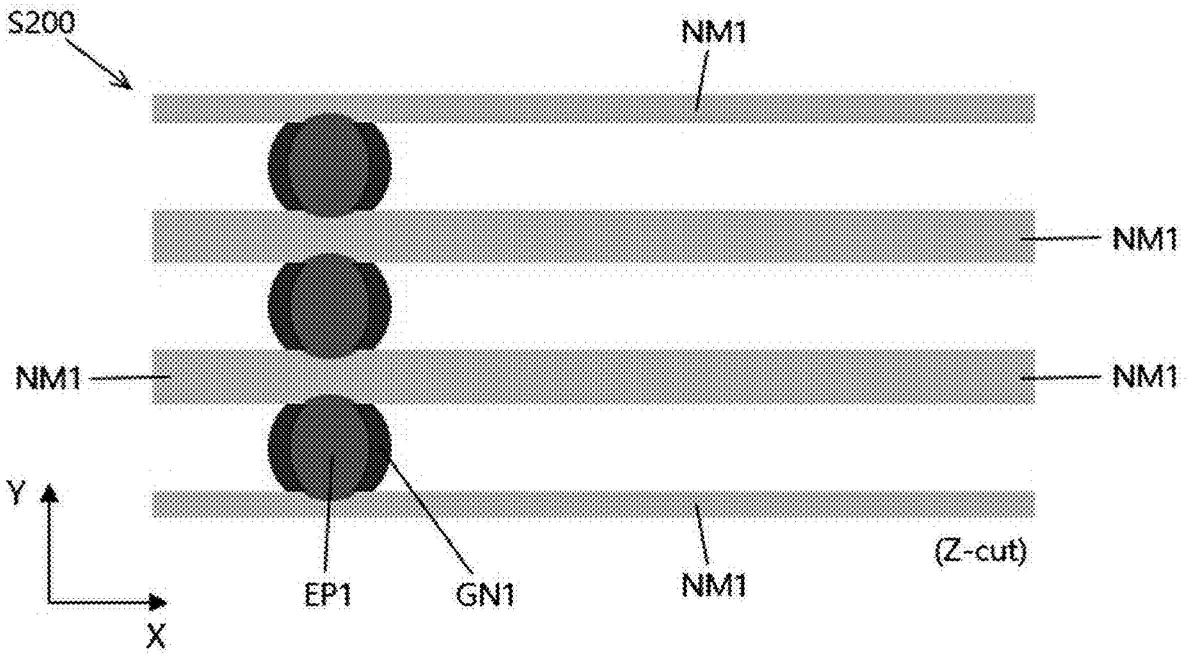

Referring to FIG. 10A and FIG. 10B, a gate insulating material layer GN1 may be formed on surface portions of the epitaxial material plug EP1 and the first epitaxial material layer EL1, and the second epitaxial material layer (EL2 in FIG. 9A) may be changed into a separation insulating layer NS1. According to one embodiment, the gate insulating material layer GN1 may be formed on the surface portion of the epitaxial material plug EP1 and the first epitaxial material layer EL1, and the second epitaxial material layer EL2 may be changed into the separation insulating layer NS1 by performing an oxidation process on the epitaxial material plug EP1 and the first and second epitaxial material layers EL1, EL2. Here, the oxidation process may be a thermal oxidation process. In the case of the first epitaxial material layer EL1 having a relatively thick thickness, the gate insulating material layer GN1 may be formed only on the surface portion of the first epitaxial material layer EL1 through the oxidation process. Meanwhile, in the case of the relatively thin second epitaxial material layer EL2, the entire second epitaxial material layer EL2 may be oxidized through the oxidation process, and as a result of it, it may become an insulating layer, that is, the separation insulating layer NS1. When using the oxidation process, the gate insulating material layer GN1 and the separation insulating layer NS1 may be oxide layers. For example, the gate insulating material layer GN1 and the separation insulating layer NS1 may be a silicon oxide layer.

However, the formation method and constituent material of the gate insulating material layer GN1 are not limited to the above descriptions and may vary in various ways. For example, the gate insulating material layer GN1 may be formed by using an atomic layer deposition (ALD) process. In this case, the gate insulating material layer GN1 may be formed to include at least any one selected from silicon oxide, silicon nitride, silicon nitride, and a high-k material. Here, the high-k material may be a material with a higher dielectric constant than silicon nitride. Also, the method for changing the second epitaxial material layer (EL2 in FIG. 9A) into the isolation insulating layer NS1 is not limited to the above descriptions and may also vary.

In this step, the first epitaxial material layer EL1 on which the gate insulating material layer GN1 is formed may be an 'epitaxial channel material layer'. At least a portion of the first epitaxial material layer EL1 may be applied as a channel region of the transistor.

Additionally, the gate insulating material layer GN1 may be formed even on the exposed surface portion of the substrate SUB10 in the step of FIG. 10A. For example, as the exposed surface portion of the substrate SUB10 is oxidized through the oxidation process, the gate insulating material layer GN1 may be formed on the substrate SUB10. Alternatively, the gate insulating material layer GN1 may be formed on the substrate SUB10 through the ALD process described above.

In this step, the structure S200 may include the epitaxial material plug EP1, the first epitaxial material layer EL1, and the gate insulating material layer GN1. The structure S200 may include the epitaxial material plug EP1 extending vertically on the substrate SUB10, the first epitaxial material layer EL1 extending horizontally from the side surface of the epitaxial material plug EP1, and the gate insulating material layer GN1 formed at least on the surface portion of the first epitaxial material layer EL1. Here, the gate insulating material layer GN1 may be formed on the surface portions of the epitaxial material plug EP1 and the first epitaxial material layer EL1. In addition, the detailed configuration of the structure S200 in this step may be referred to from the structures of FIGS. 10A and 10B.

The method of preparing the structure S200 as shown in FIGS. 10A and 10B may vary. In other words, the process described with reference to FIGS. 1A to 10B may be modified in various ways.

Figure 11A:
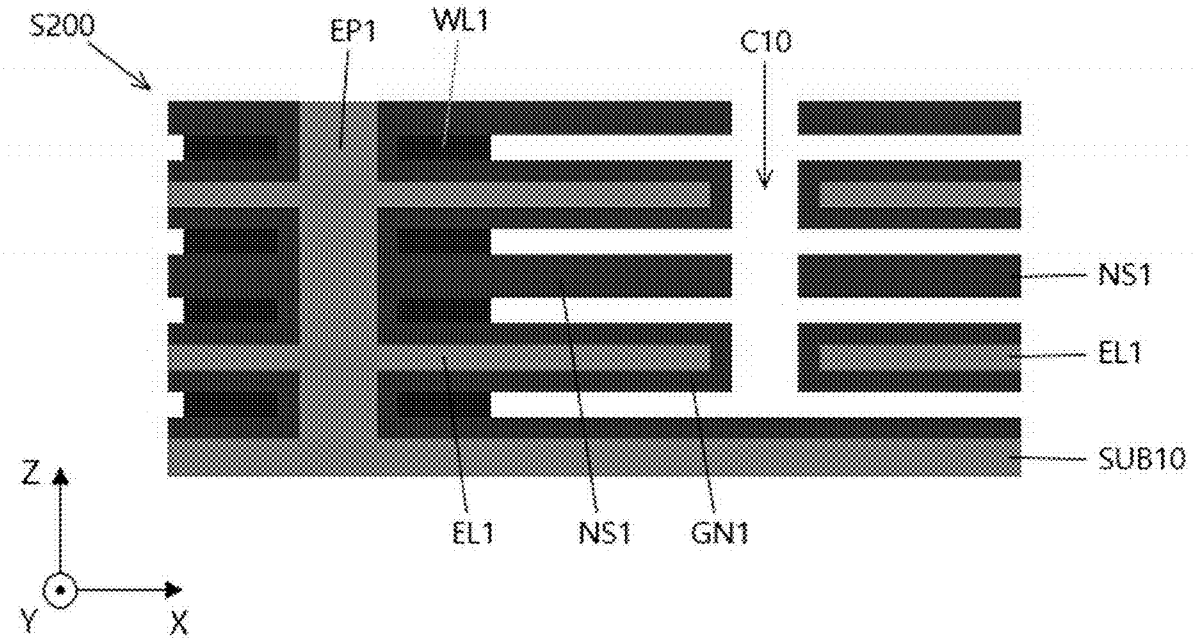
Figure 11B:
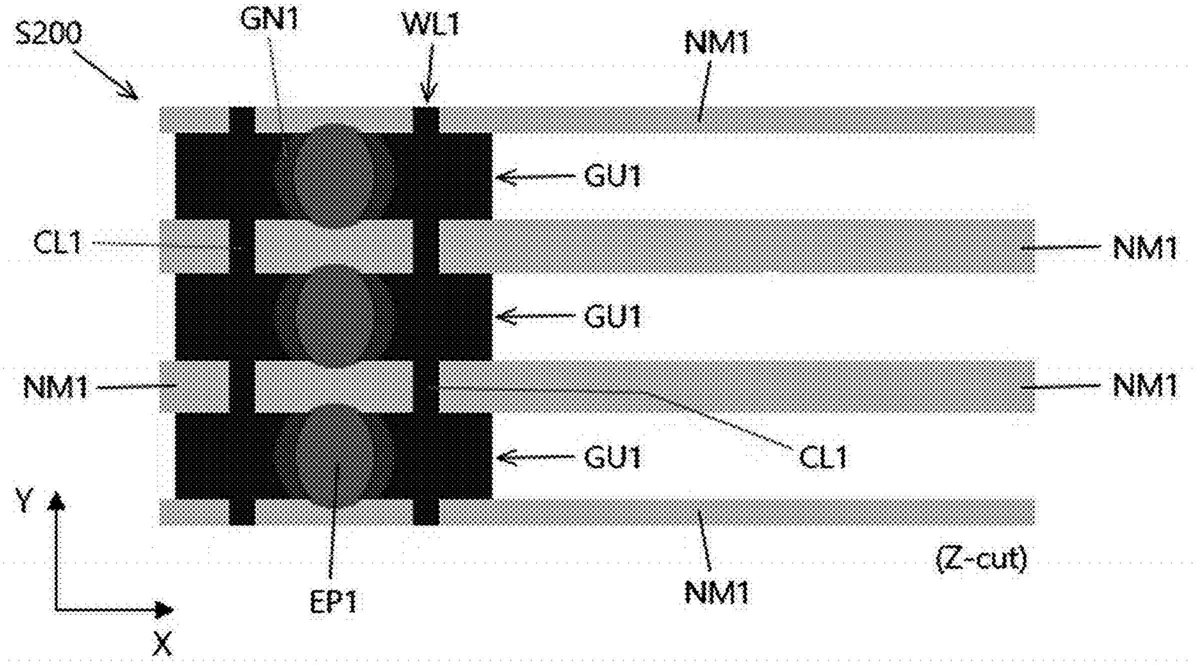

Referring to FIGS. 11A and 11B, in the structure S200, a word line WL1 in contact with the gate insulating material layer GN1 in the transistor formation region around the epitaxial material plug EP1 may be formed so that a transistor including the word line WL1 may be defined. For example, after depositing a word line material through the first etched portion C10, the word line WL1 may be formed in the transistor formation region by recessing the deposited word line material to an appropriate range. The word line material may be formed, for example, through an ALD process. The material for the word line may include a metal or a metal compound.

According to one embodiment, the word line WL1 may include a gate unit structure GU1 formed to correspond to the first epitaxial material layer EL1 in the transistor formation region. A plurality of gate unit structures GU1 may be arranged to be spaced apart from each other in the second direction (e.g., Y-axis direction), and the word line WL1 may further include a connection line portion CL1 connecting the plurality of gate unit structures GU1 in the second direction (e.g., Y-axis direction). The connection line portion CL1 may be formed at a position corresponding to the 'pattern connection portion' described above. The connection line portion CL1 may also be referred to as a 'gate pattern connection portion' or a 'connection pattern portion.' The connection line portion CL1 may be arranged to form a plurality of lines. For example, the connection line portion CL1 may be arranged to form two lines, and the epitaxial material plug EP1 may be positioned between the two lines.

Also, according to one embodiment, the word line WL1 may have a dual gate structure. A first gate layer and a second gate layer may be disposed below and above a region of one first epitaxial material layer EL1 corresponding to one channel, respectively, and the first and the second gate layers may form a dual gate structure. Gate controllability may be improved by the dual gate structure.

Figure 12A:
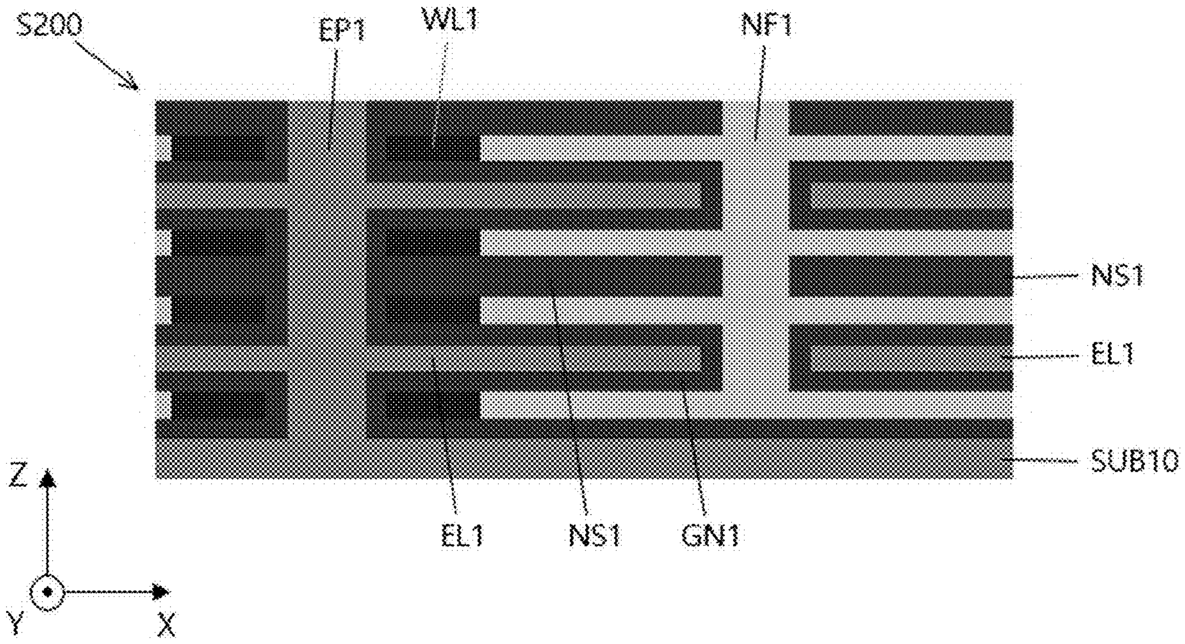
Figure 12B:
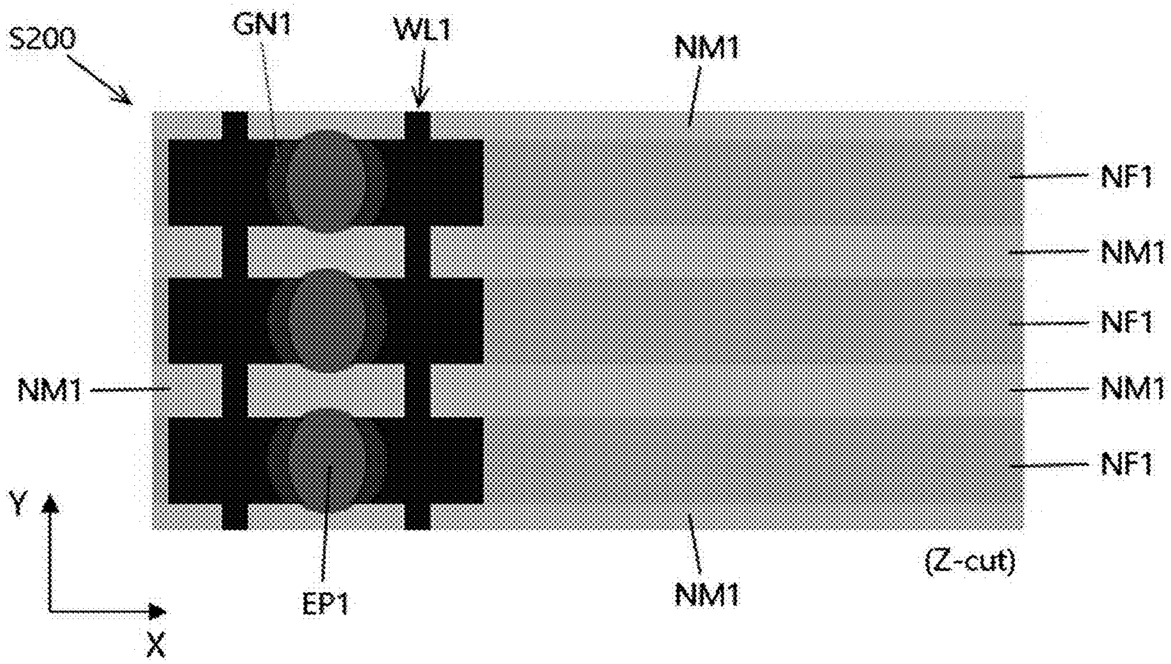

Referring to FIGS. 12A and 12B, a filling insulating layer NF1 which fills a space around the gate insulating material layer GN1 and the isolation insulating layer NS1 in the capacitor formation region adjacent to the transistor formation region, and the first etched portion (C10 in FIG. 11A) may be formed within the structure S200. The filling insulating layer NF1 may be formed to fill empty spaces, that is, gaps, within the structure S200. As a non-limiting example, the filling insulating layer NF1 may include a silicon nitride (e.g., SiNx) or may be formed by a silicon nitride (e.g., SiNx). The filling insulating layer NF1 may be formed of a material other than silicon nitride. When forming the filled insulating layer NF1, a planarization process may be further performed on the upper surface and surrounding portion after depositing the insulator for the filled insulating layer NF1.

Figure 13A:
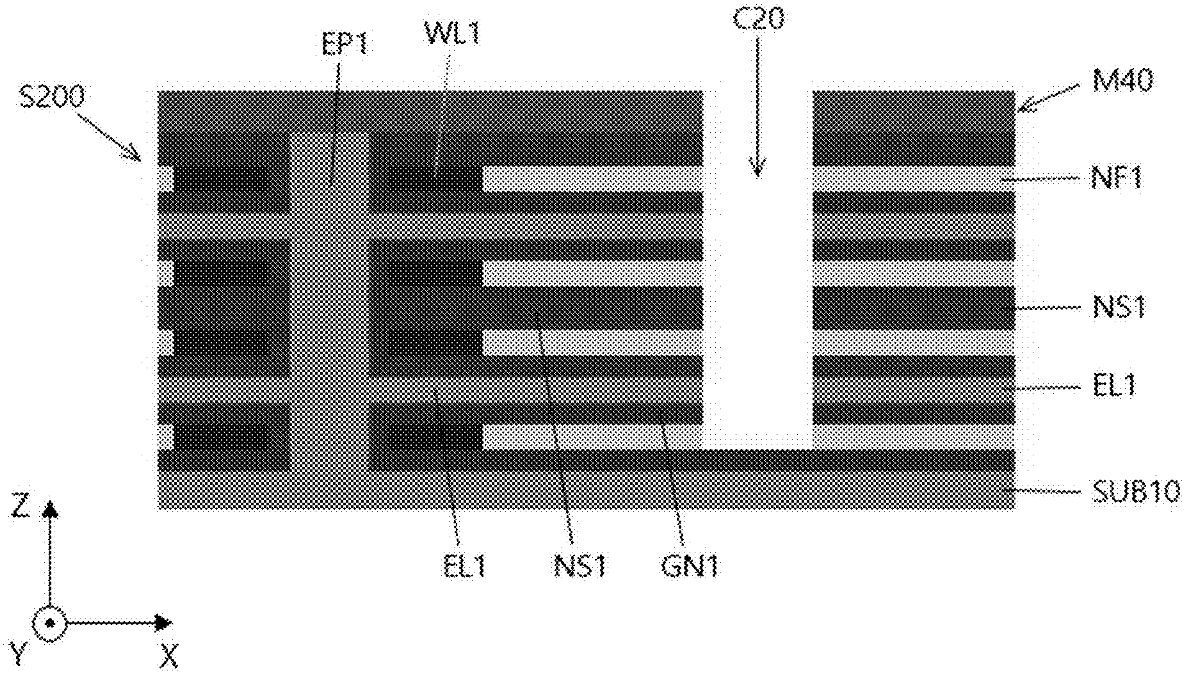
Figure 13B:
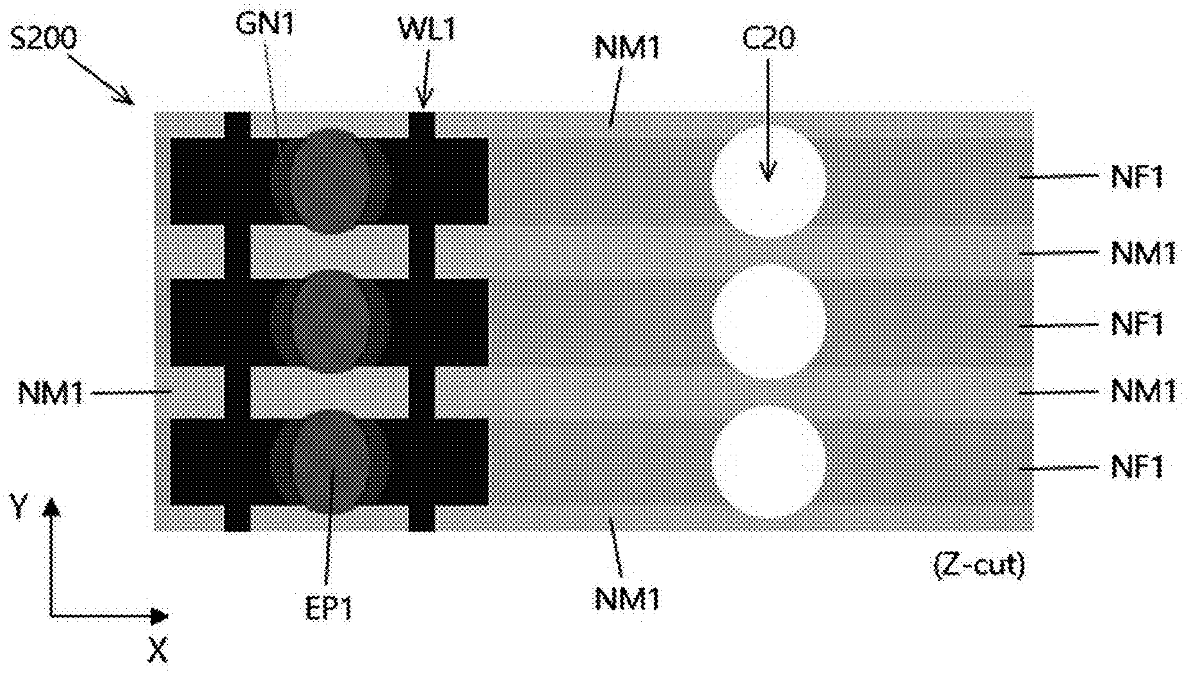

Referring to FIGS. 13A and 13B, a second etched portion C20 may be formed by etching the portion of the filling insulating layer NF1 filled in the first etched portion (C10 in FIG. 11A) and its surrounding portion in the capacitor formation region of the structure S200. The second etched portion C20 may have a vertical hole structure. The second etched portion C20 may have a vertical hole structure penetrating through the filling insulating layer NF1 in the capacitor formation region. As shown in FIG. 13B, when observed from above direction, a plurality of second etched portions C20 penetrating through each of a plurality of cell regions may be formed. The second etched portion C20 may be formed by using a dry etching method. The second etched portion C20 may be referred to as a second capacitor region hole.

The central axis of the second etched portion C20 may be the same or substantially the same as the central axis of the first etched portion (C10 in FIG. 6B). The second etched portion C20 may have a slightly larger size (diameter) than that of the first etched portion (C10 in FIG. 6B). When forming the second etched portion C20, an end portion of the gate insulating material layer GN1 exposed toward the first etched portion (C10 in FIG. 11A) may be etched and removed, and an end portion of the first epitaxial material layer EL1 may be exposed toward the second etched portion C20.

The fourth mask pattern M40 may be used to form the second etched portion C20. The fourth mask pattern M40 may have a predetermined opening area. The fourth mask pattern M40 may be, for example, a photoresist pattern. After forming the second etched portion C20, the fourth mask pattern M40 may be removed.

Next, by using the method as illustrated in FIGS. 14A to 16B, a recess portion (R1 in FIG. 16A) may be formed by recessing the first epitaxial material layer EL1, the gate insulating material layer GN1, and the filling insulating layer NF1 exposed by the second etched portion C20 in the capacitor formation region.

Figure 14A:
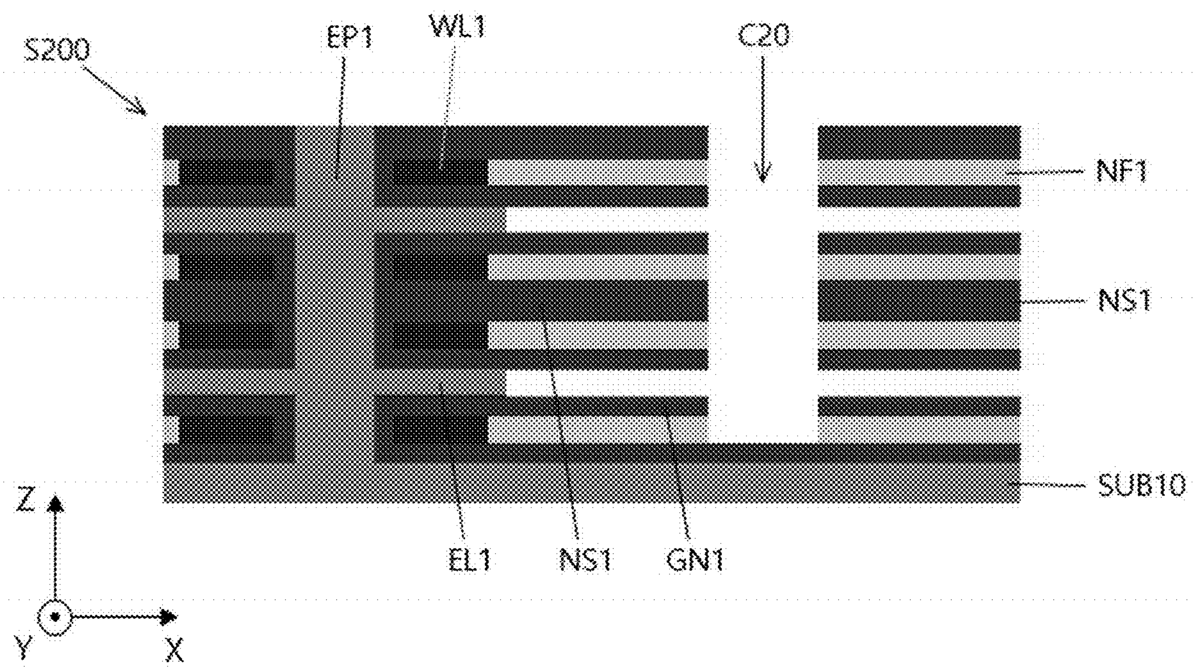
Figure 14B:
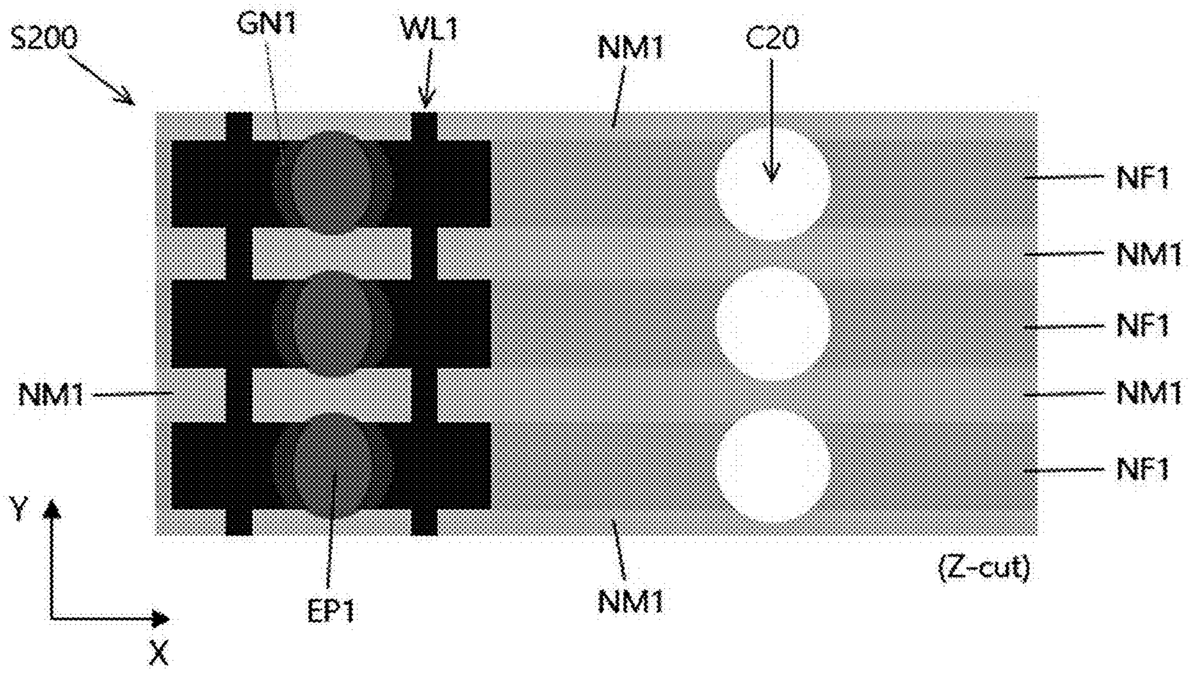

Referring to FIGS. 14A and 14B, the first epitaxial material layer EL1 exposed by the second etched portion C20 may be recessed (etched). The first epitaxial material layer EL1 may be selectively etched by injecting a predetermined wet etchant, that is, a wet etching solution, through the second etched portion C20. The etching range of the first epitaxial material layer EL1 may be controlled by adjusting the condition of the etching process.

Figure 15A:
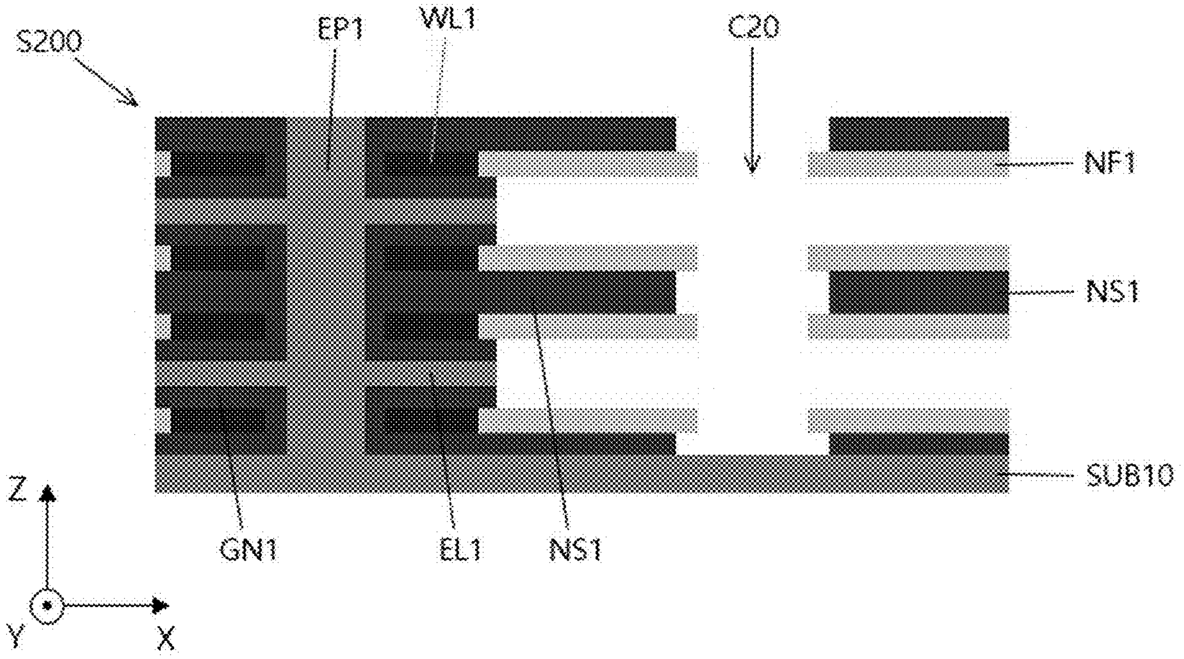
Figure 15B:
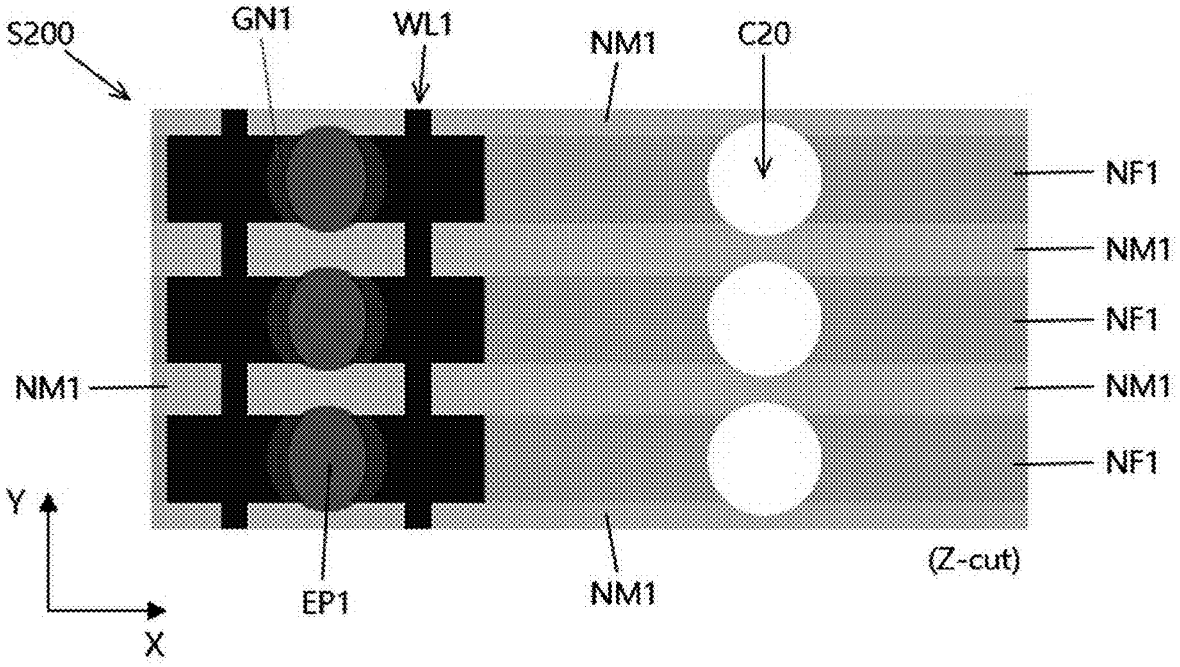

Referring to FIGS. 15A and 15B, in the step of FIG. 14A, the exposed gate insulating material layer GN1 may be recessed (etched) by injecting a predetermined wet etchant into the space formed by the recess of the first epitaxial material layer EL1. The etching range of the gate insulating material layer GN1 may be controlled by adjusting the condition of the etching process.

Figure 16A:
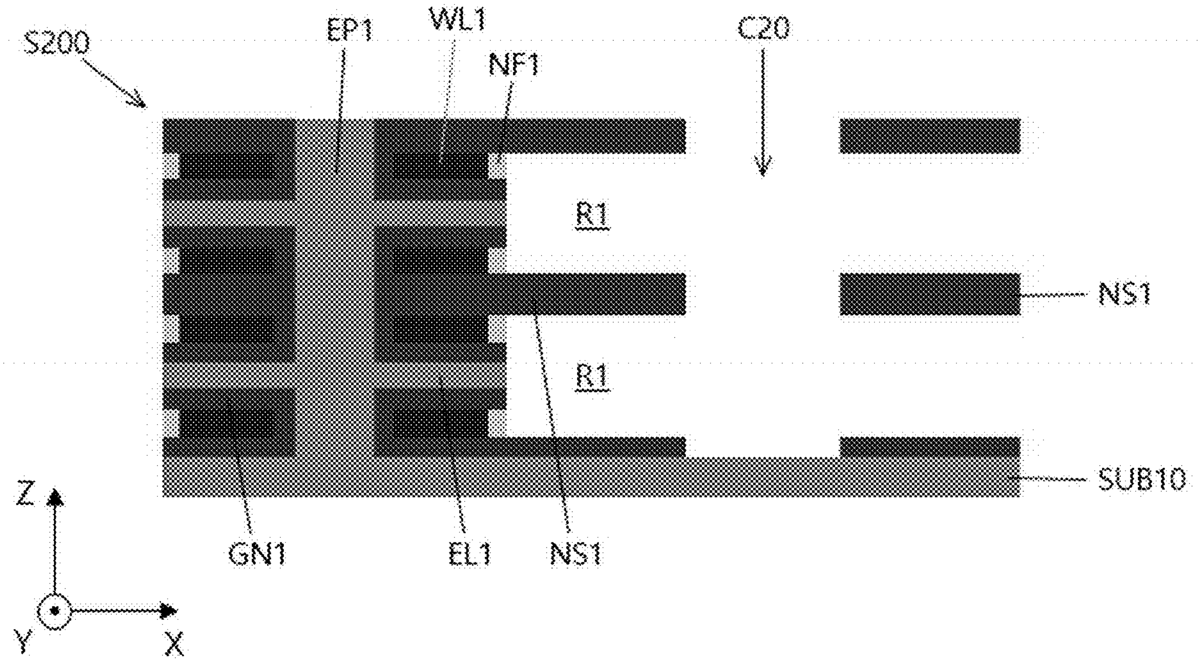
Figure 16B:
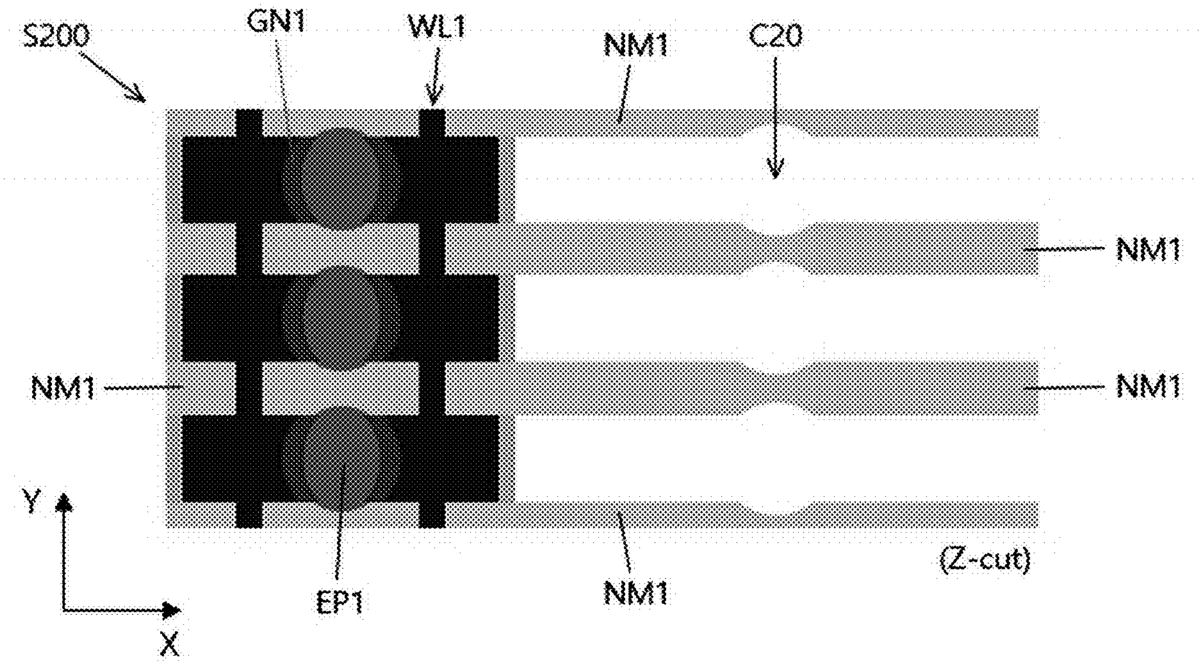

Referring to FIGS. 16A and 16B, in the step of FIG. 15A, the exposed filling insulating layer NF1 may be recessed (etched) by injecting a predetermined wet etchant into the space formed by the recess of the gate insulating material layer GN1. The etching range of the filling insulating layer NF1 may be controlled by adjusting the condition of the etching process.

The recess portion R1 may be formed in the capacitor formation region using the method described with reference to FIGS. 14A to 16B. The opening area of the separation insulating layer NS1 may be slightly expanded through the process of FIGS. 14A to 16B.

Next, a capacitor connected to one end of the first epitaxial material layer EL1 corresponding to the channel of the transistor may be formed in the capacitor formation region by using the method illustrated in FIGS. 17A to 21B.

Figure 17A:
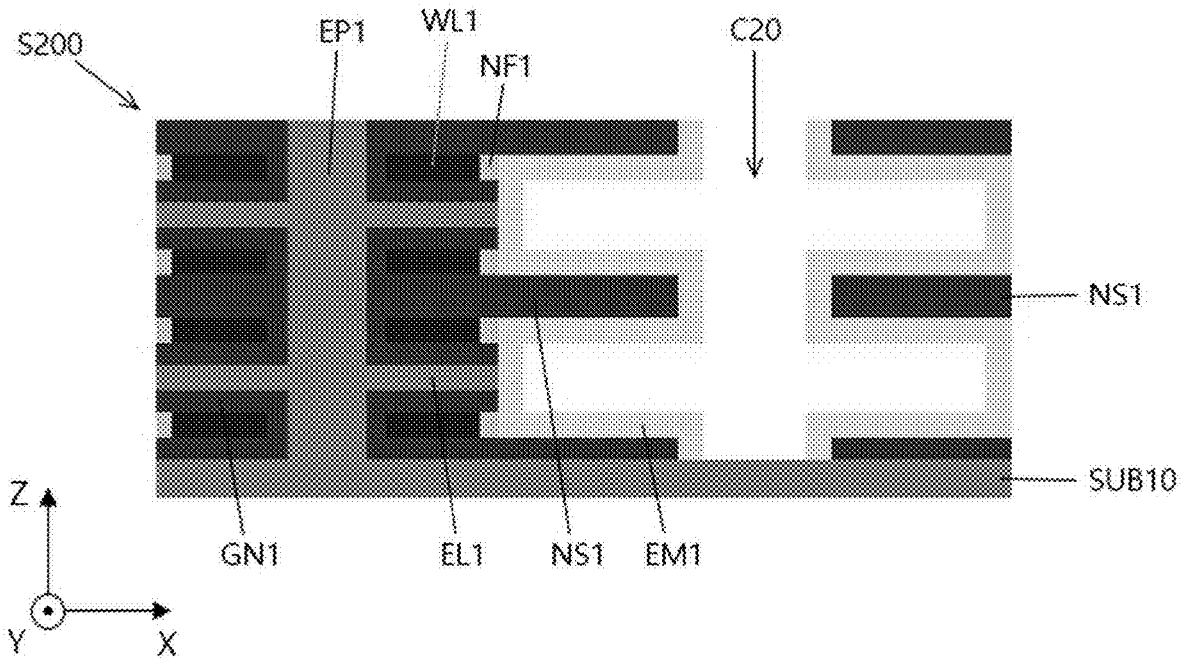
Figure 17B:
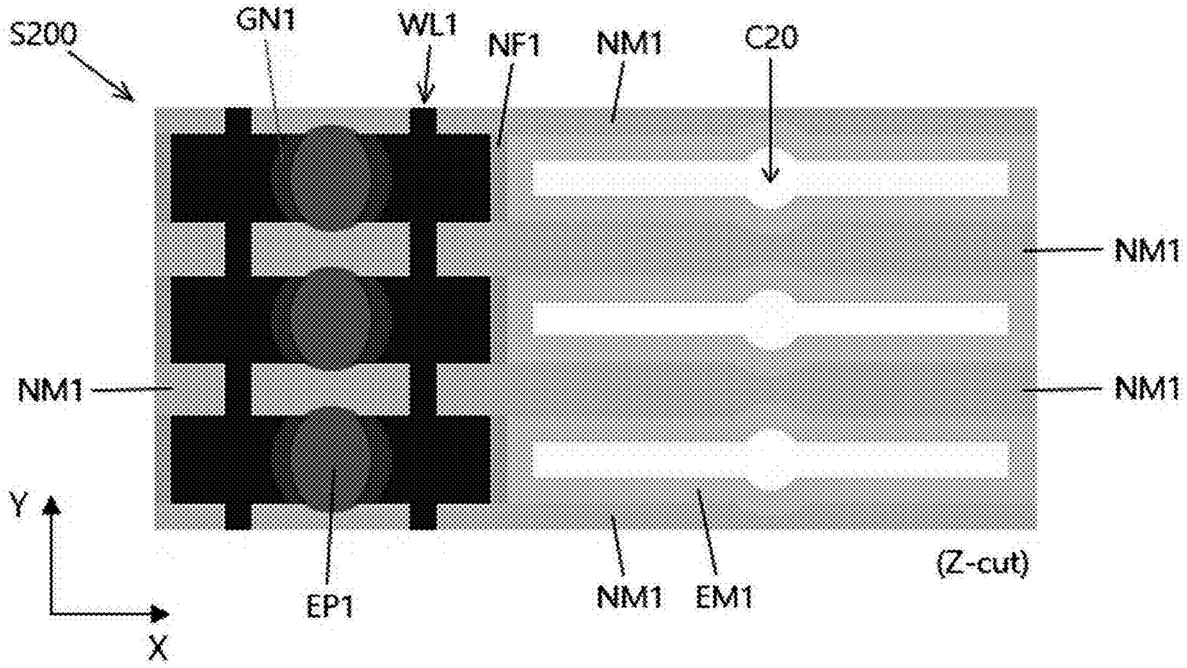

Referring to FIGS. 17A and 17B, an electrode member EM1 connected to one end of the first epitaxial material layer EL1 may be formed on an inner surface of the recessed portion (R1 in FIG. 16A). The electrode member EM1 may be connected to one end of the first epitaxial material layer EL1 of the transistor. The electrode member EM1 may be said to be an electrode layer (first electrode layer) for a capacitor. The electrode member EM1 may be conformally formed along the surface shapes of the separation insulating layer NS1 and the gate insulating material layer GN1. The electrode member EM1 may be formed, for example, through an ALD process.

Figure 18A:
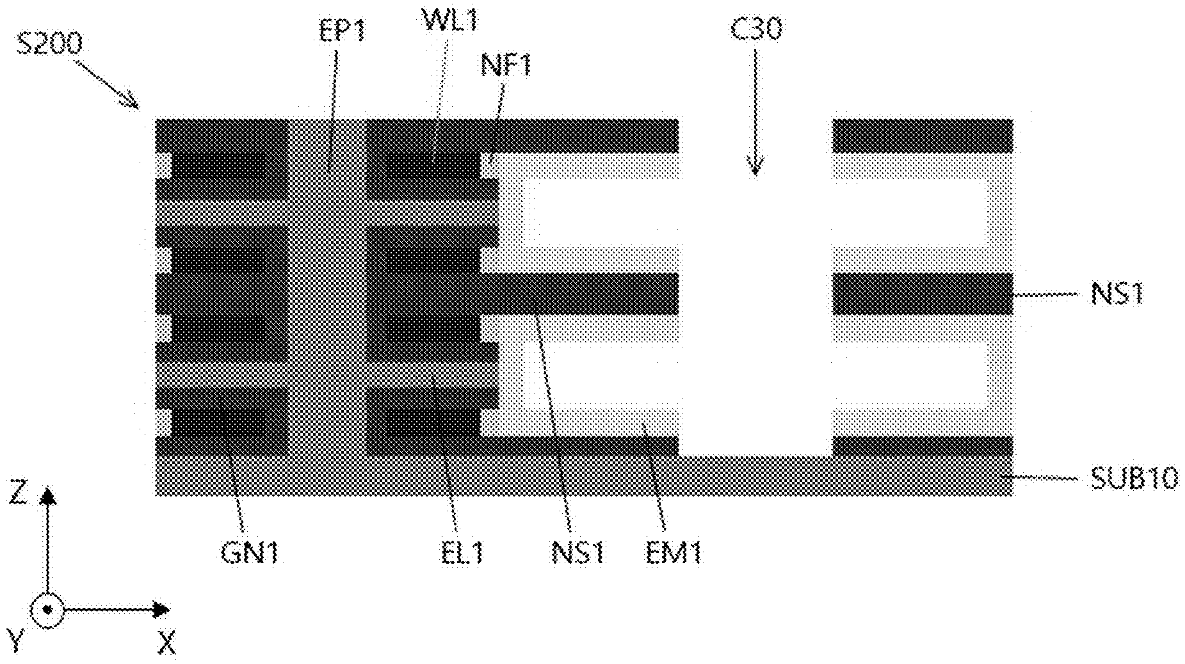
Figure 18B:
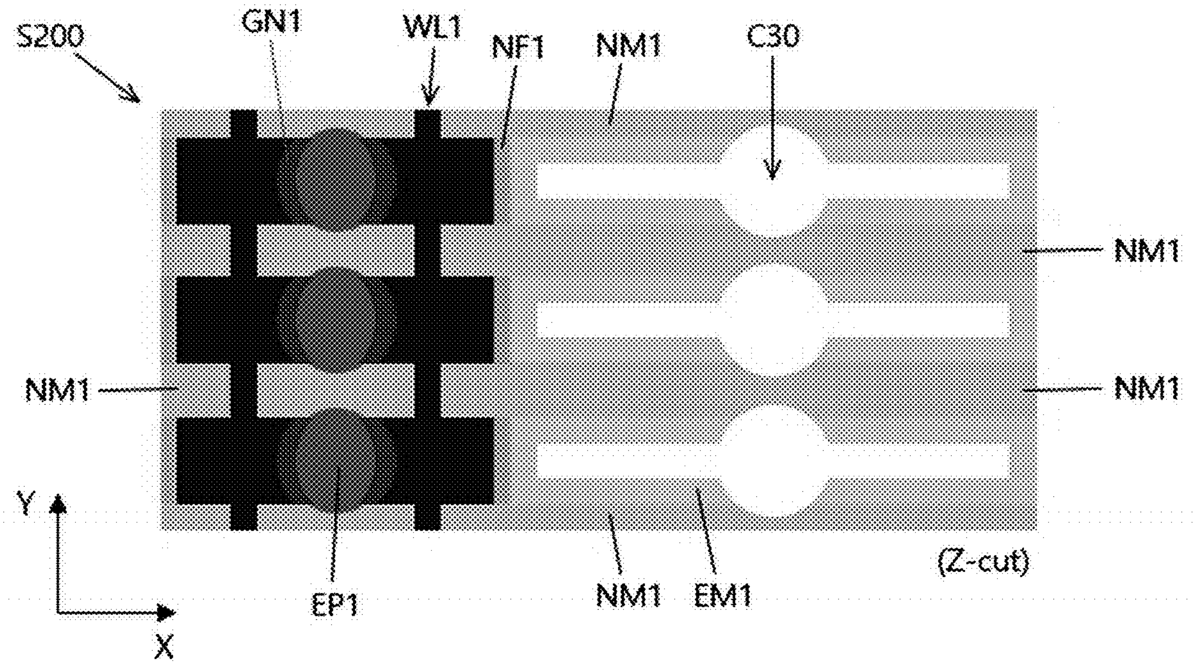

Referring to FIGS. 18A and 18B, a third etched portion C30 may be formed in a region corresponding to the second etched portion (C20 in FIG. 16A) in the capacitor formation region. The third etched portion C30 may be formed by etching a portion of the electrode member EM1. The third etched portion C30 may have a vertical hole structure. The electrode member EM1 may be separated into individual capacitor regions through the process of this step. In other words, the electrode member EM1 may be separated as a unit cell region.

According to one embodiment, the third etched portion C30 may be formed through an etchback process on a portion of the electrode member EM1 formed on the inner wall of the second etched portion (C20 in FIG. 17A). The third etched portion C30 may be a hole region which is substantially same as the second etched portion (C20 in FIG. 17A).

Figure 19A:
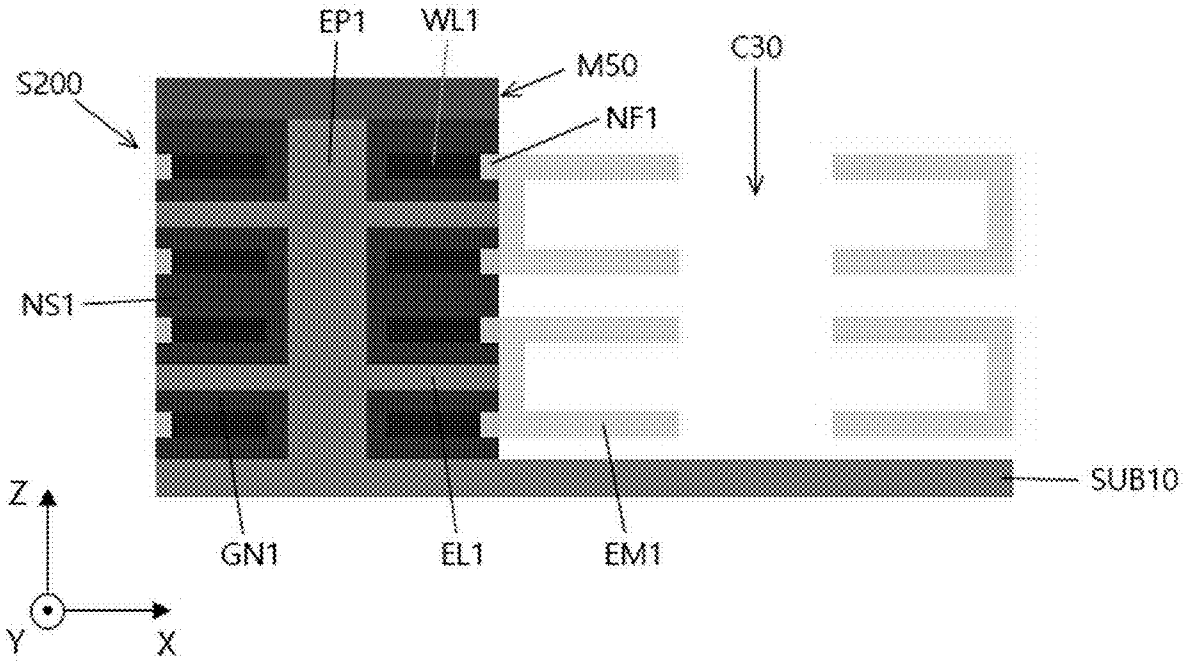
Figure 19B:
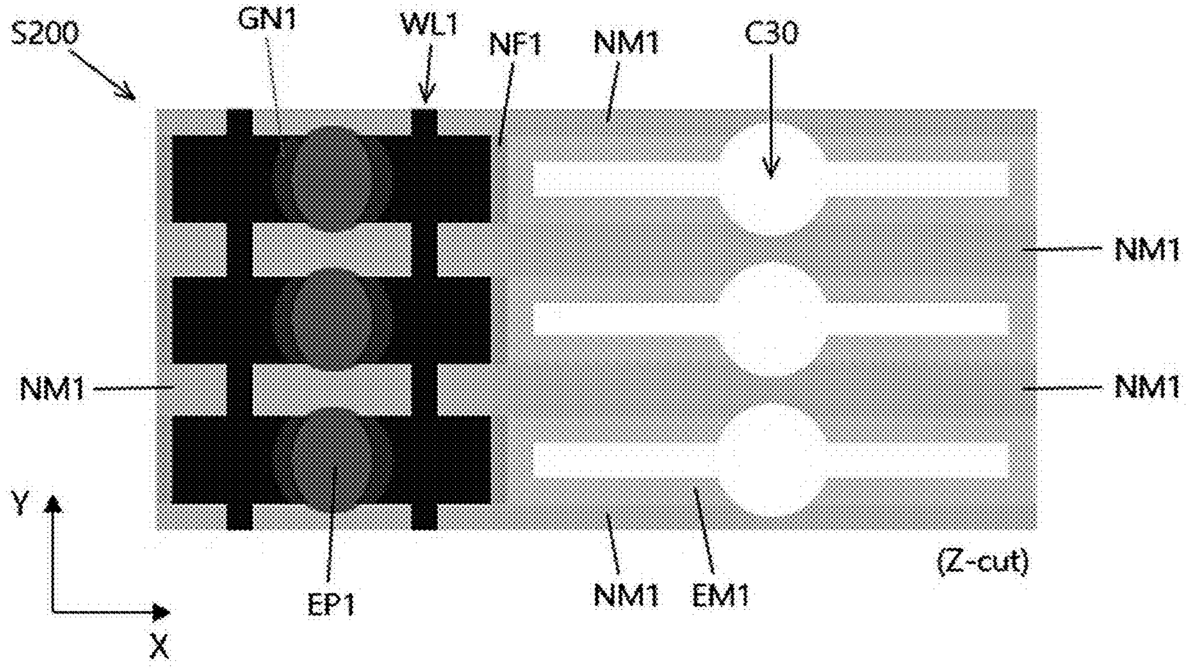

Referring to FIG. 19A and FIG. 19B, an outer surface of the electrode member EM1 may be exposed by recessing (etching) the separation insulating layer NS1 in the capacitor formation region after forming the electrode member EM1. At this time, the portion of the gate insulating material layer GN1 formed on the upper surface of the substrate SUB10 may also be recessed (etched).

A fifth mask pattern M50 may be used to expose the capacitor formation region while hiding the transistor formation region for the processes of FIGS. 19A and 19B. The fifth mask pattern M50 may be, for example, a photoresist pattern. After the processes of FIGS. 19A and 19B, the fifth mask pattern M50 may be removed.

Figure 20A:
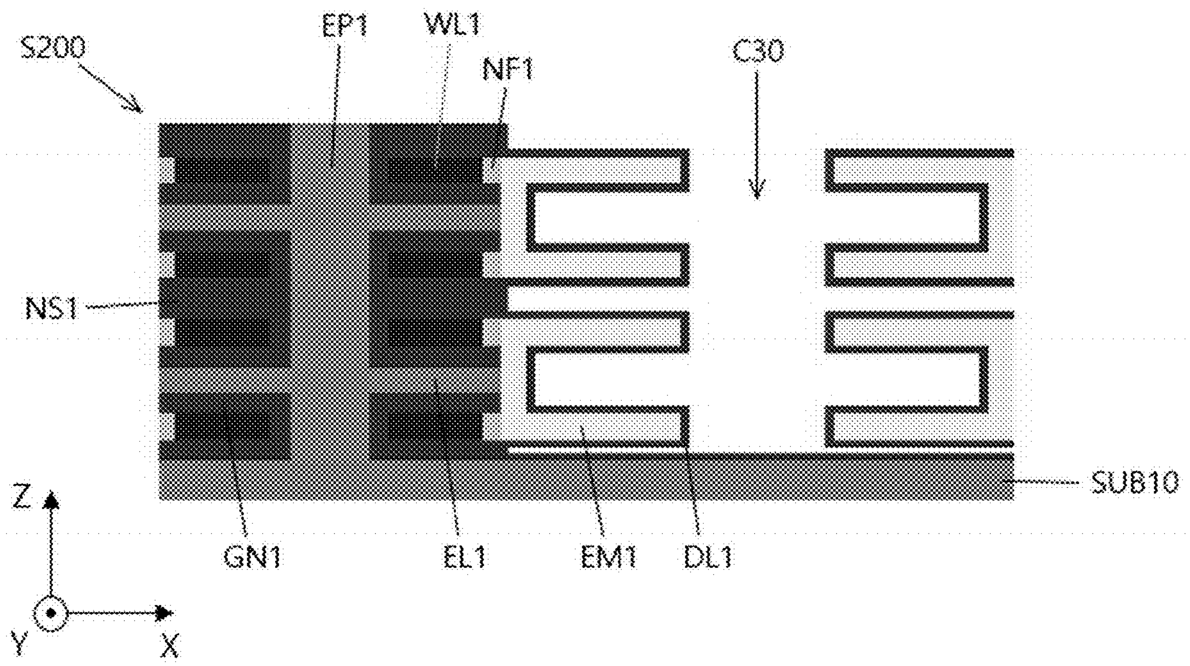
Figure 20B:
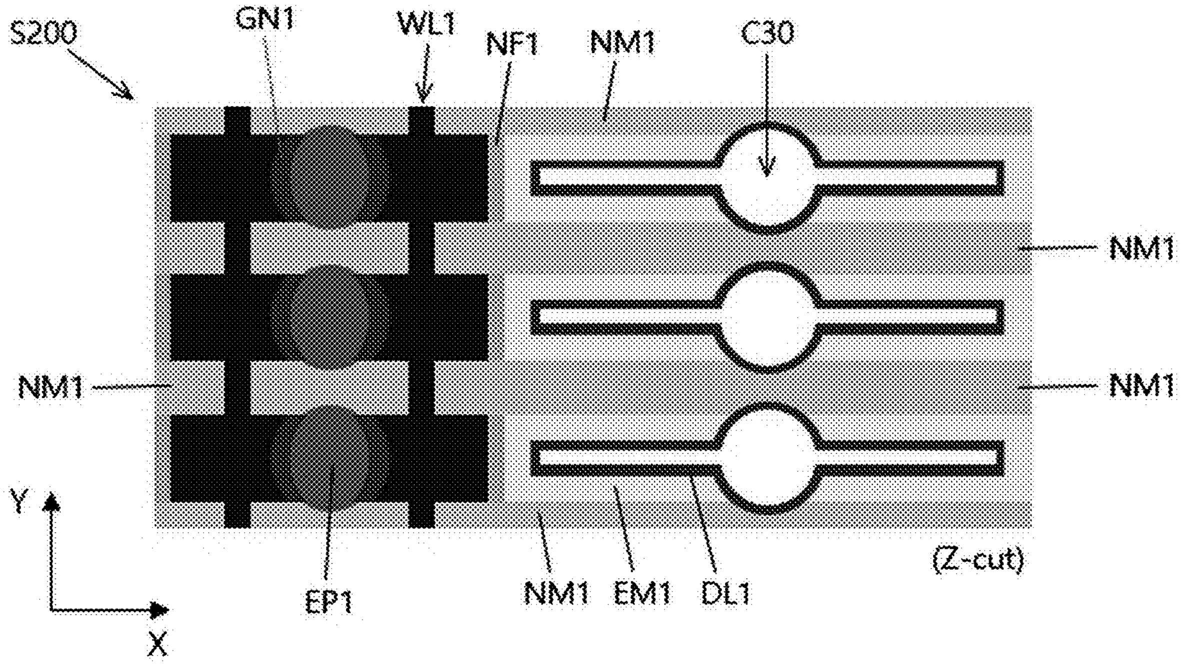

Referring to FIGS. 20A and 20B, a dielectric layer DL1 may be formed on the electrode member EM1 in the capacitor formation region. The dielectric layer DL1 may be a dielectric layer for a capacitor. The dielectric layer DL1 may be formed conformally according to the surface shape of the electrode member EM1. The dielectric layer DL1 may be formed (deposited) through, for example, an ALD process. The dielectric layer DL1 may be formed to include at least one of various dielectric materials. For example, the dielectric layer DL1 may include a high-k material with a higher dielectric constant than that of a silicon nitride. The specific material of the dielectric layer DL1 may vary.

Additionally, the dielectric layer DL1 may be formed on the surface of the substrate SUB10 in the capacitor formation region. The portion of the dielectric layer DL1 formed in contact with the surface of the substrate SUB10 may function as a type of separating film.

Figure 21A:
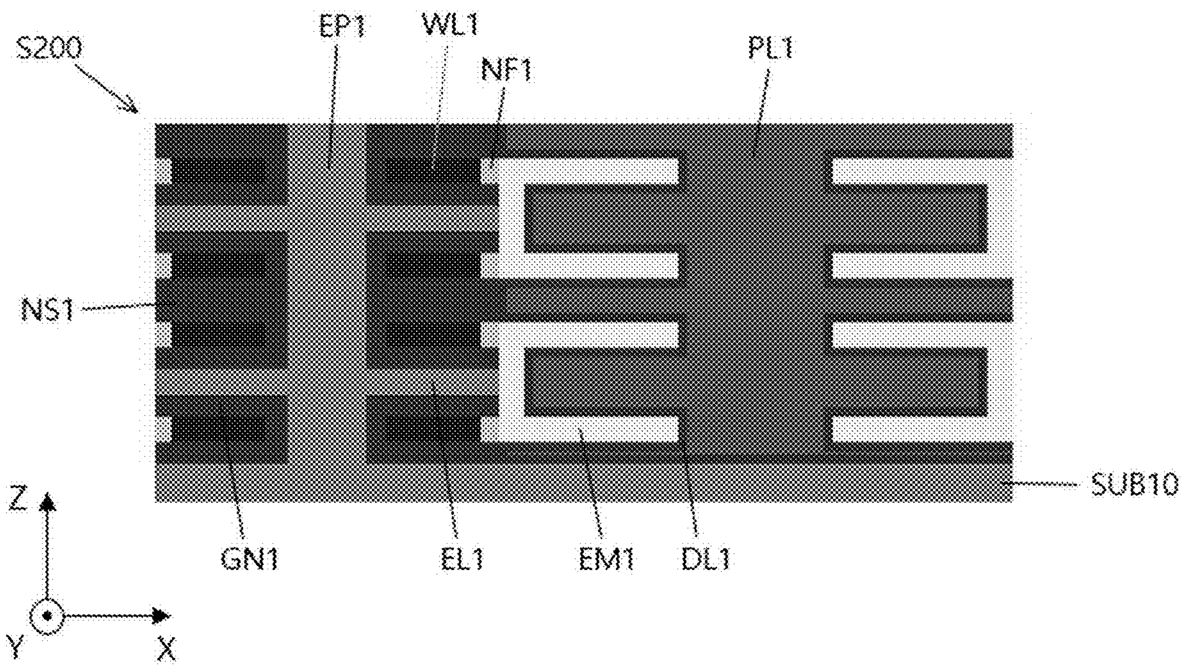
Figure 21B:
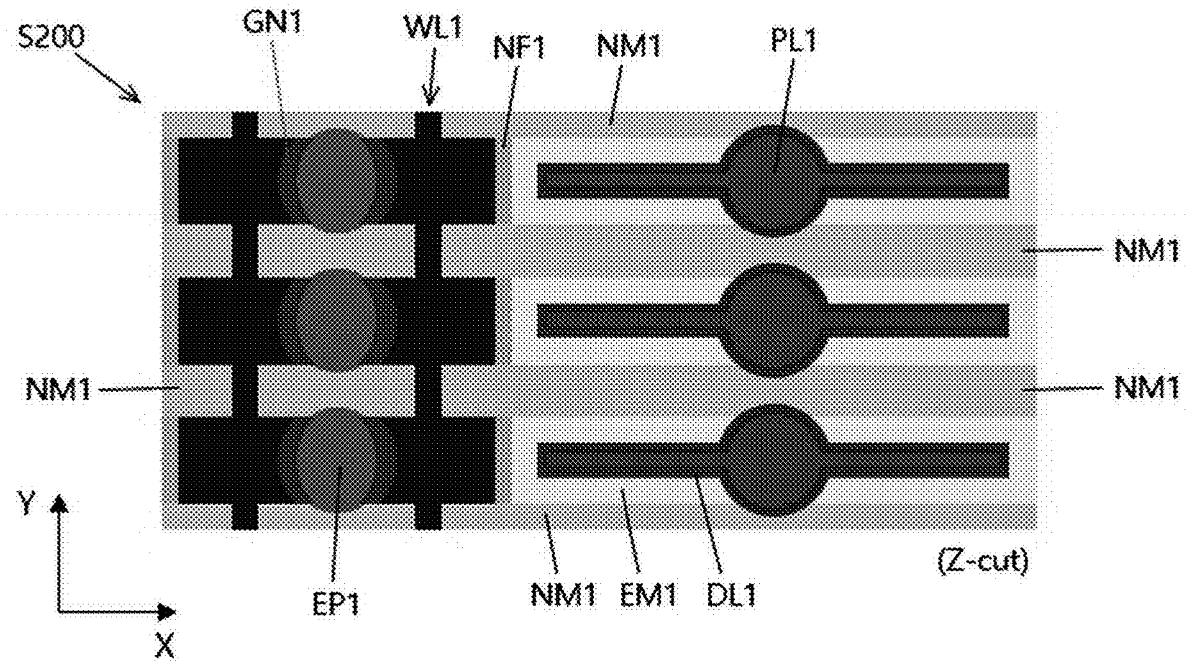

Referring to FIGS. 21A and 21B, a plate electrode PL1 may be formed on the dielectric layer DL1 in the capacitor formation region. The plate electrode PL1 may be said to be an electrode layer (second electrode layer) for a capacitor. The plate electrode PL1 may be formed to fill the inside of the third etched portion (C30 in FIG. 20A) and the electrode member EM1, and to fill the space between the electrode members EM1. The plate electrode PL1 may be formed to include one or more of various electrode materials used in semiconductor device processing. The plate electrode PL1 may have a type of line shape. Therefore, the plate electrode PL1 may be said to be a plate electrode line. The electrode member EM1, the dielectric layer DL1, and the plate electrode PL1 may constitute a capacitor.

According to an embodiment of the present invention, it may be easy to maximize the height of the capacitor. In other words, according to embodiments of the present invention, maximum use of the capacitor height may be possible. In this regard, the performance of the manufactured memory device may be improved.

In FIG. 17A to FIG. 21B illustrate and describe the method of forming the capacitor through an example, but in some cases, the method for forming the capacitor and the specific structure of the capacitor may vary.

Figure 22A:
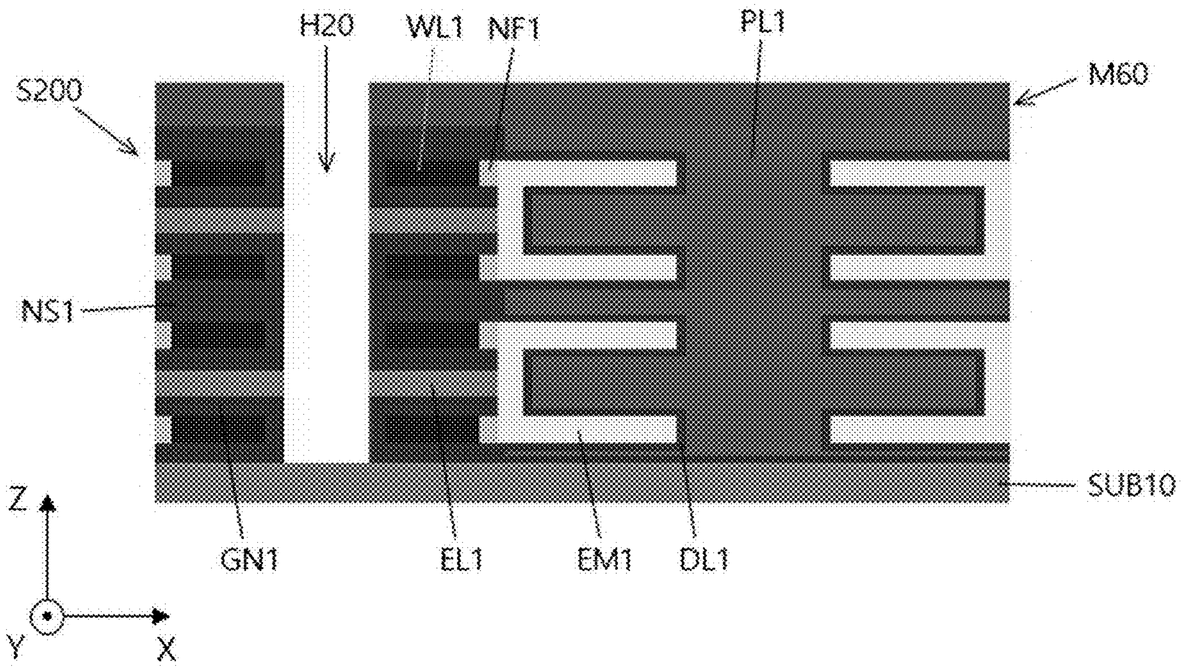
Figure 22B:
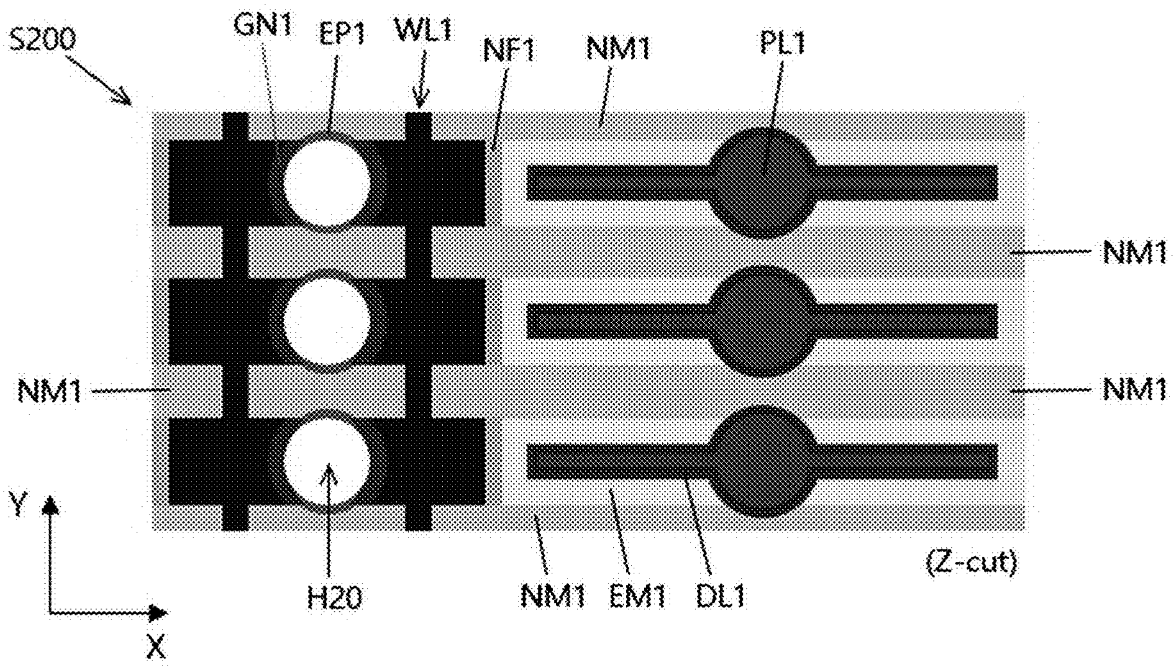

Referring to FIGS. 22A and 22B, a second vertical hole H20 may be formed by etching the epitaxial material plug (EP1 in FIG. 21A). The other end of the first epitaxial material layer EL1 corresponding to the channel of the transistor may be exposed to an inner surface of the second vertical hole H20. Also, the gate insulating material layer GN1 may be exposed to the inner surface of the second vertical hole H20. The second vertical hole H20 may be disposed in a position corresponding to the first vertical hole (H10 in FIG. 4A) and may have a diameter similar to or slightly smaller than that of the first vertical hole (H10 in FIG. 4A).

The sixth mask pattern M60 may be used to form the second vertical hole H20. The sixth mask pattern M60 may have a predetermined opening pattern. The sixth mask pattern M60 may be, for example, a photoresist pattern. After forming the second vertical hole H20, the sixth mask pattern M60 may be removed.

Figure 23A:
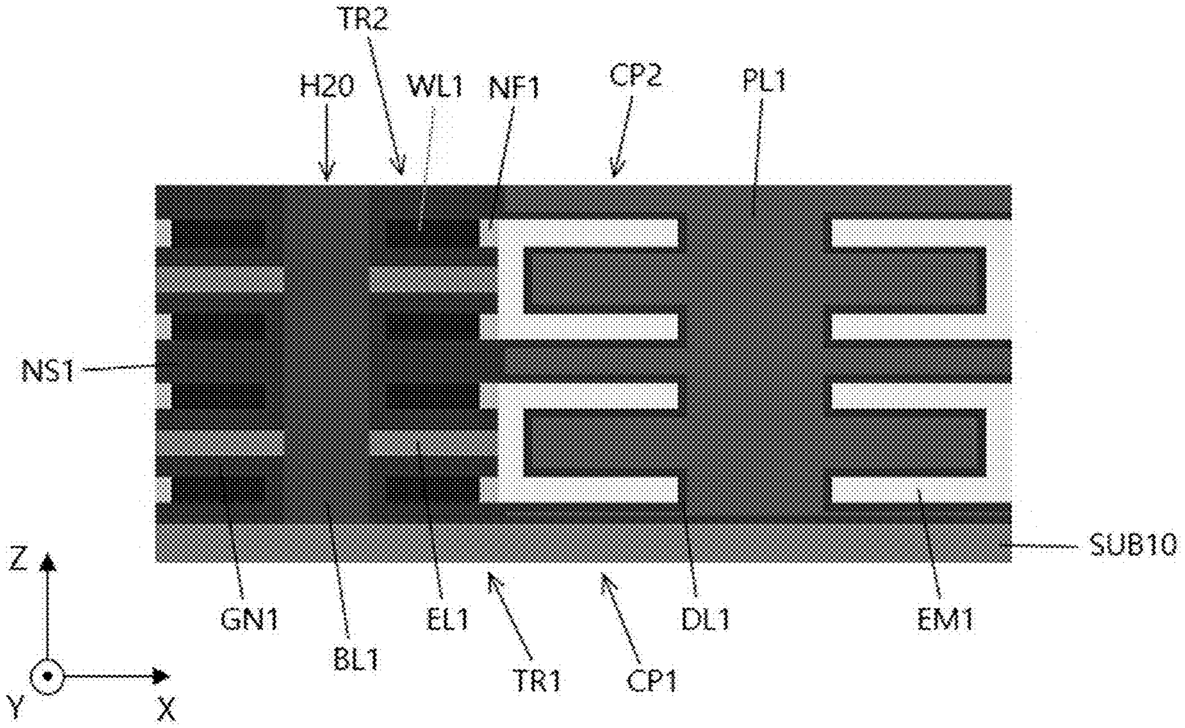
Figure 23B:
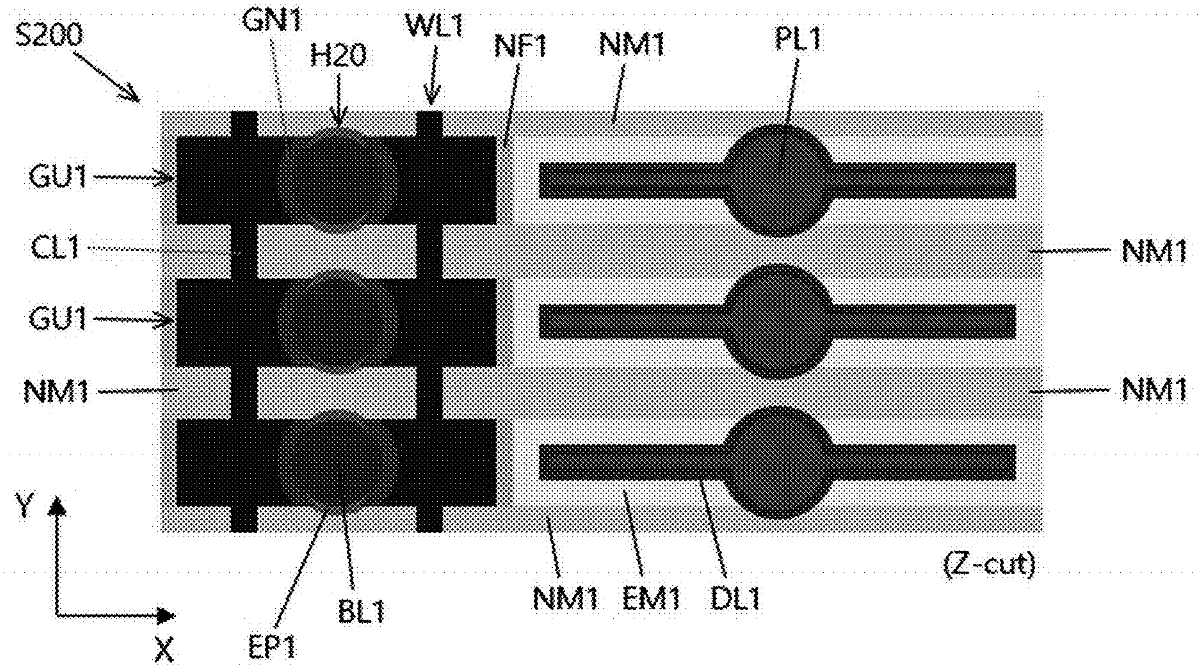

Referring to FIGS. 23A and 23B, a bit line BL1 may be formed in the second vertical hole H20. The bit line BL1 may be connected (contacted) to the other end of the first epitaxial material layer EL1 corresponding to the channel of the transistor. The bit line BL1 may have a pillar shape which vertically penetrates through the structure S200 formed on the substrate SUB10. The bit line BL1 may be electrically connected to an end of the first epitaxial material layer EL1 in a lateral direction. A plurality of bit lines BL1 connected to a plurality of first epitaxial material layers EL1 may be formed.

Although not shown, if there is a conductive material of the bit line BL1 deposited above the second vertical hole H20, it may be removed through, for example, an etchback process.

The method of forming the bit line BL1 described with reference to FIGS. 22A to 23B is only an example and may vary. Also, the timing at which the bit line BL1 is formed is not limited to the above and may vary. The timing at which the bit line BL1 is formed may vary within a technically non-contradictory range.

In the device structure of FIG. 23A, the lower first epitaxial material layer EL1, the corresponding word line WL1, and the gate insulating material layer GN1 between them may constitute a first transistor TR1. In addition, the lower electrode member EM1 electrically connected to the first transistor TR1 on the lateral side of the first transistor TR1, and the dielectric layer DL1 contacting the same and the plate electrode PL1 may constitute a first capacitor CP1. Also, the first transistor TR1 and the first capacitor CP1 may constitute one memory cell (a lower memory cell). The first transistor TR1 and the first capacitor CP1 may be arranged in a horizontal direction.

In addition, the upper first epitaxial material layer EL1, the corresponding word line WL1, and the gate insulating material layer GN1 between them may constitute a second transistor TR2. In addition, the upper electrode member EM1 electrically connected to the second transistor TR2 on the lateral side of the second transistor TR2, and the dielectric layer DL1 contacting the same and the plate electrode PL1 may constitute a second capacitor CP2. Also, the second transistor TR2 and the second capacitor CP2 may constitute one memory cell (an upper memory cell). The second transistor TR2 and the second capacitor CP2 may be arranged in a horizontal direction. The second transistor TR2 may be placed above the first transistor TR1, and the second capacitor CP2 may be placed above the first capacitor CP1.

Although not shown, the device structures such as those of FIGS. 23A and 23B may be repeatedly arranged in the Z-axis direction, may be repeatedly arranged in the X-axis direction, and may be repeatedly arranged in the Y-axis direction. According to these embodiments of the present invention, it is possible to implement a memory device which may remarkably improve integration degree and have excellent performance and operation characteristics. The memory device may be a stack-type memory device of a dual gate type having a horizontal arrangement and a stacked structure. Additionally, the memory device according to an embodiment of the present invention may be a vertical DRAM device or a three-dimensional DRAM device.

Hereinafter, a memory device according to an embodiment of the present invention will be additionally described with reference to FIGS. 23A and 23B.

Referring to FIGS. 23A and 23B, the memory device according to an embodiment of the present invention may include a plurality of memory cells stacked in a vertical direction. Each of the plurality of memory cells may include a transistor and a capacitor electrically connected to the transistor laterally. The transistor may correspond to TR1 and TR2, and the capacitor may correspond to CP1 and CP2. The transistor may include an epitaxial material layer EL1 corresponding to a channel, a word line WL1 disposed to face the epitaxial material layer EL1, and a gate insulating layer GN1 disposed between them. The capacitor may include an electrode member EM1 electrically connected to the transistor, a dielectric layer DL1 disposed on a surface of the electrode member EM1, and a plate electrode PL1 disposed on a surface of the dielectric layer DL1. Additionally, the memory device may include a bit line BL1 connected to a plurality of transistors of the plurality of memory cells. The bit line BL1 may extend in the vertical direction.

The epitaxial material layer EL1 may include a single crystal semiconductor. For example, the epitaxial material layer EL1 may include any one selected from single crystal Si, single crystal Ge, and single crystal SiGe. The transistor may have excellent performance by including the epitaxial material layer EL1.

The word line WL1 may include a plurality of gate unit structures GU1 spaced apart from each other and a connection line portion CL1 connecting the plurality of gate unit structures GU1. According to one embodiment, the plurality of gate unit structures GU1 may be disposed between a plurality of bit lines BL1 and a plurality of capacitors, and the connection line portion CL1 may have a narrower width than that of each of the plurality of gate unit structures GU1 and may be arranged to connect the plurality of gate unit structures GU1 in an extending direction of the word line WL1. The plurality of gate unit structures GU1 may be considered as being disposed between the plurality of bit lines BL1 and the plurality of electrode members EM1. Additionally, the plurality of gate unit structures GU1 may be disposed on both sides of the bit line BL1, and the connection line portion CL1 may also be disposed on both sides of the bit line BL1. Additionally, the transistor may have a dual gate structure. Two word lines WL1 disposed above and below one epitaxial material layer EL1 may form a dual gate structure.

According to one embodiment, the gate insulating layer GN1 may be provided to extend between the word line WL1 and the bit line BL1. That is, a portion of the gate insulating layer GN1 may be extended and disposed between the word line WL1 and the bit line BL1.

According to one embodiment, a filling insulating layer NF1 may be provided between each of the plurality of gate unit structures GU1 and the electrode member EM1 corresponding thereto. The gate unit structure GU1 may contact a first side surface of the filling insulating layer NF1, and the electrode member EM1 may contact a second side surface of the filling insulating layer NF1. Also, an insulating material layer NM1 which is a separate material layer from the filling insulating layer NF1 may be provided between the plurality of gate unit structures GU1.

Additionally, the memory device may further include an epitaxial material plug EP1 in contact with a portion of a side surface of the bit line BL1. The epitaxial material plug EP1 may be a portion which remains after forming the second vertical hole H20 in the step of FIG. 22B. The epitaxial material plug EP1 may contact both side surfaces of the bit line BL1 in the second direction (e.g., Y-axis direction).

In addition, the memory device according to an embodiment of the present invention may have the structural features and the effects related thereto as shown in FIGS. 23A and 23B.

According to the embodiments of the present invention described above, it is possible to implement a memory device (a stack-type memory device) and a manufacturing method thereof which may increase the degree of integration and ensure excellent performance, while also enabling easy processing and low manufacturing costs. In addition, according to embodiments of the present invention, it is possible to implement a memory device (a stack-type memory device) and a manufacturing method thereof which may improve performance such as mobility by using a single crystal channel material and may easily maximize the height of the capacitor. In particular, according to one embodiment of the present invention, when compared to the existing method using a Si/SiGe stacked structure, it is possible to manufacture a memory device which may lower the process difficulties, reduce manufacturing costs and have improved performance by forming an epitaxial material layer (epitaxial channel layer) according to the SEG (selective epitaxial growth) method using a stack of an insulating layer and a sacrificial layer. Since the embodiment of the present invention uses a selective epitaxial process for a single material, the process may be greatly facilitated as compared with the existing method of repeatedly performing the epitaxial process for multiple materials (e.g., Si and SiGe).

According to one example, a memory device according to an embodiment of the present invention may be configured to include a horizontal stack-type DRAM device. However, at least some of the device structures and manufacturing methods according to embodiments of the present invention may be applied not only for DRAM devices, but also for other memory devices (e.g., PRAM, RRAM, SRAM, flash memory, MRAM, FRAM, etc.) or the technological fields which implement the logic devices in which the logic circuits are integrated.

In this specification, the preferred embodiments of the present invention have been disclosed, and although specific terms have been used, they are only used in a general sense to easily explain the technological content of the present invention and to help understanding the present invention, and they are not used to limit the scope of the present invention. It is obvious to those having ordinary skill in the related art to which the present invention belong that other modifications based on the technological idea of the present invention may be implemented in addition to the embodiments disclosed herein. It will be understood to those having ordinary skill in the related art that in connection with memory devices and manufacturing methods thereof according to the embodiments described with reference to FIGS. 1A to 23B, various substitutions, changes, and modifications may be made without departing from the technological spirit of the present invention. Therefore, the scope of the invention should not be determined by the described embodiments, but should be determined by the technological concepts described in the claims.

The embodiments of the present invention may be applied to semiconductor/electronic devices and manufacturing methods thereof. For example, the embodiments of the present invention may be applied to memory devices and manufacturing methods thereof.

The invention claimed is:

1. A manufacturing method of a memory device comprising:

forming a stack including a first insulating layer, a first sacrificial layer, a second insulating layer, and a second sacrificial layer which are sequentially stacked on a substrate;

forming a patterned stack having at least one pattern portion having first and second sacrificial layer patterns obtained from the first and second sacrificial layers, respectively by patterning the stack, wherein the pattern portion has a shape extending in a first direction and is provided with etched regions on both sides of the pattern portion along a second direction perpendicular to the first direction;

forming a structure including the patterned stack and an insulating material by filling the etched regions on both sides of the at least one pattern portion with the insulating material;

forming a first vertical hole penetrating through the first and second sacrificial layer patterns of the pattern portion in the structure;

forming an epitaxial material plug filling the first vertical hole from the substrate by using an epitaxial growth method;

forming a first etched portion spaced apart from the epitaxial material plug in the structure;

forming first and second horizontal holes extending in the first direction by removing the first and second sacrificial layer patterns exposed by the first etched portion, respectively;

forming first and second epitaxial material layers filling each of the first and second horizontal holes by using an epitaxial growth method from a side surface of the epitaxial material plug;

removing the first and second insulating layers from the structure;

forming a gate insulating material layer on surfaces of the epitaxial material plug and the first epitaxial material layer, and changing the second epitaxial material layer into a separation insulating layer;

defining a transistor including a word line by forming the word line in contact with the gate insulating material layer of a transistor formation region around the epitaxial material plug in the structure;

forming a filling insulating layer filling a space surrounding the gate insulating material layer and the isolation insulating layer of a capacitor formation region adjacent to the transistor formation region, and the first etched portion in the structure;

forming a second etched portion by etching a portion of the filling insulating layer filled in the first etched portion and a surrounding portion thereof in the capacitor formation region of the structure;

forming a recess portion by recessing the first epitaxial material layer, the gate insulating material layer, and the filling insulating layer exposed by the second etched portion in the capacitor formation region;

forming a capacitor connected to one end of the first epitaxial material layer corresponding to a channel of the transistor in the capacitor formation region; and forming a second vertical hole by etching the epitaxial material plug, and forming a bit line connected to the other end of the first epitaxial material layer corresponding to the channel of the transistor in the second vertical hole.

2. The manufacturing method of a memory device of claim 1, wherein the first and second insulating layers include a silicon nitride, and the first and second sacrificial layers include a silicon oxide.

3. The manufacturing method of a memory device of claim 1, wherein the insulating material has a material composition different from the first and second insulating layers and the first and second sacrificial layers.

4. The manufacturing method of a memory device of claim 1, wherein the second sacrificial layer has a thinner thickness than that of the first sacrificial layer.

5. The manufacturing method of a memory device of claim 1, wherein the epitaxial material plug, and the first and second epitaxial material layers includes a single crystal semiconductor.

6. The manufacturing method of a memory device of claim 5, wherein the epitaxial material plug, and the first and second epitaxial material layers includes at least one selected from the group consisting of single crystal Si, single crystal Ge, and single crystal SiGe.

7. The manufacturing method of a memory device of claim 1, wherein the forming the gate insulating material layer on the surfaces of the epitaxial material plug and the first epitaxial material layer, and changing the second epitaxial material layer into the separation insulating layer includes performing an oxidation process for the epitaxial material plug and the first and second epitaxial material layers, and the entire second epitaxial material layer is oxidized by the oxidation process.

8. The manufacturing method of a memory device of claim 1, wherein the patterned stack is formed to include a plurality of the pattern portions spaced apart from each other in the second direction and a pattern connection portion connecting the plurality of pattern portions in the second direction.

9. The manufacturing method of a memory device of claim 8, wherein the word line includes a gate unit structure formed to correspond to the first epitaxial material layer of the transistor formation region, wherein a plurality of the gate unit structures are arranged to be spaced apart from each other in the second direction, the word line further includes a connection line portion connecting the plurality of gate unit structures in the second direction, wherein the connection line portion is formed at a position corresponding to the pattern connection portion.

10. The manufacturing method of a memory device of claim 1, wherein the word line has a dual gate structure.

11. The manufacturing method of a memory device of claim 1, wherein the first etched portion has a vertical hole structure penetrating through the pattern portion in the capacitor formation region.

12. The manufacturing method of a memory device of claim 1, wherein the second etched portion has a vertical hole structure penetrating through the filling insulating layer in the capacitor formation region.

13. The manufacturing method of a memory device of claim 1, wherein the forming the capacitor includes:

forming an electrode member connected to the one end of the first epitaxial material layer on an inner surface of the recess portion;

forming a dielectric layer on the electrode member; and forming a plate electrode on the dielectric layer.

14. The manufacturing method of a memory device of claim 13, further comprising exposing an outer surface of the electrode member by recessing the separation insulating layer in the capacitor formation region after forming the electrode member, wherein the dielectric layer and the plate electrode are sequentially formed after exposing the outer surface of the electrode member.

15. The manufacturing method of a memory device of claim 1, wherein the first insulating layer, the first sacrificial layer, the second insulating layer, and the second sacrificial layer constitute one unit stack, wherein the forming the stack, the unit stack is stacked repeatedly on the substrate.

16. The manufacturing method of a memory device of claim 15, wherein the transistor is a first transistor, and the capacitor is a first capacitor, wherein the memory device is formed to further include a second transistor disposed above the first transistor and a second capacitor disposed above the first capacitor.

17. A manufacturing method of a memory device comprising:

forming a structure including an epitaxial material plug extending vertically on a substrate, an epitaxial material layer extending horizontally from a side surface of the epitaxial material plug, and a gate insulating material layer formed at least on a surface of the epitaxial material layer;

defining a transistor including a word line by forming the word line in contact with the gate insulating material layer in a transistor formation region around the epitaxial material plug in the structure;

removing the epitaxial material layer and the gate insulating material layer from a capacitor formation region adjacent to the transistor formation region of the structure, and forming a capacitor connected to one end of the epitaxial material layer corresponding to a channel of the transistor; and forming a vertical hole by etching the epitaxial material plug, and forming a bit line connected to the other end of the epitaxial material layer corresponding to the channel of the transistor in the vertical hole.

18. A memory device comprising:

a plurality of memory cells stacked in a vertical direction, wherein each of the plurality of memory cells includes a transistor and a capacitor electrically connected to a lateral side of the transistor, wherein the transistor includes an epitaxial material layer corresponding to a channel, a word line disposed to face the epitaxial material layer, and a gate insulating layer disposed therebetween, wherein the capacitor includes an electrode member electrically connected to the transistor, a dielectric layer disposed on a surface of the electrode member, and a plate electrode disposed on a surface of the dielectric layer;

wherein the memory device includes a bit line being connected to a plurality of transistors of the plurality of memory cells and extending in a vertical direction, wherein the word line includes a plurality of gate unit structures spaced apart from each other and a connection line portion connecting the plurality of gate unit structures, wherein the gate insulating layer is provided to extend between the word line and the bit line.

19. The memory device of claim 18, wherein the epitaxial material layer includes at least one selected from the group consisting of single crystal Si, single crystal Ge, and single crystal SiGe.

20. The memory device of claim 18, wherein the plurality of gate unit structures are disposed between the plurality of bit lines and the plurality of capacitors, wherein the connection line portion has a narrower width than that of each of the plurality of gate unit structures and is arranged to connect the plurality of gate unit structures to an extension direction of the word line.

21. The memory device of claim 18, wherein the plurality of gate unit structures are disposed on both sides of the bit line, and the connection line portion is disposed on both sides of the bit line.

22. The memory device of claim 18, wherein a filling insulating layer is provided between each of the plurality of gate unit structures and the electrode member corresponding thereto.

23. The memory device of claim 22, wherein an insulating material layer which is a separate material layer from the filling insulating layer is provided between the plurality of gate unit structures.

24. The memory device of claim 18, further comprising an epitaxial material plug in contact with a portion of a side surface of the bit line.

* * * * *